(12) United States Patent
Hargis et al.

(10) Patent No.: US 8,238,389 B2
(45) Date of Patent: Aug. 7, 2012

(54) TEMPERATURE CONTROL SYSTEM FOR A FREQUENCY CONVERTED DIODE LASER

(75) Inventors: David E. Hargis, San Diego, CA (US); Neil E. Vadnais, Oceanside, CA (US); John O'Shaughnessy, Carlsbad, CA (US); Eric B. Takeuchi, San Diego, CA (US); Scott Paterson, Vista, CA (US)

(73) Assignee: CVI Laser, LLC, Albuquerque, NM (US)

( * ) Notice: Subject to any disclaimer, the term of this patent is extended or adjusted under 35 U.S.C. 154(b) by 0 days.

(21) Appl. No.: 13/035,727

(22) Filed: Feb. 25, 2011

(65) Prior Publication Data

US 2011/0188523 A1 Aug. 4, 2011

Related U.S. Application Data

(62) Division of application No. 11/455,223, filed on Jun. 15, 2006, now Pat. No. 7,899,105.

(60) Provisional application No. 60/691,271, filed on Jun. 15, 2005, provisional application No. 60/763,497, filed on Jan. 30, 2006.

(51) Int. Cl.
*H01S 3/10* (2006.01)
(52) U.S. Cl. ............... 372/21; 372/92; 372/28; 372/22; 372/102; 372/29.02; 372/29.021
(58) Field of Classification Search .................. 372/21, 372/22, 28, 29.02, 29.021, 92, 102
See application file for complete search history.

(56) References Cited

U.S. PATENT DOCUMENTS

| | | | |
|---|---|---|---|
| 5,544,271 A | 8/1996 | Lim | |
| 6,048,444 A | 4/2000 | Takahashi et al. | |
| 6,101,201 A | 8/2000 | Hargis et al. | |
| 6,133,995 A | 10/2000 | Kubota | |
| 6,215,807 B1 | 4/2001 | Reilly | |
| 6,480,513 B1 | 11/2002 | Kapany et al. | |
| 6,490,309 B1 | 12/2002 | Okazaki et al. | |
| 6,592,822 B1 | 7/2003 | Chandler | |
| 6,603,780 B2 | 8/2003 | Miyai | |
| 6,836,489 B2 * | 12/2004 | Nishimura et al. | 372/20 |
| 6,920,159 B2 | 7/2005 | Sidorin et al. | |
| 6,980,293 B1 | 12/2005 | Harada | |
| 7,505,495 B2 | 3/2009 | Fratti et al. | |
| 7,548,567 B2 | 6/2009 | Kupershmidt et al. | |
| 7,949,025 B2 * | 5/2011 | Olea | 372/38.02 |
| 2001/0017868 A1 | 8/2001 | Kraenert et al. | |
| 2001/0021210 A1 | 9/2001 | Nakaya et al. | |
| 2002/0061032 A1 * | 5/2002 | Miura et al. | 372/4 |
| 2002/0097772 A1 * | 7/2002 | Dautremont-Smith et al. | 372/102 |

(Continued)

*Primary Examiner* — Jessica Stultz
*Assistant Examiner* — Delma R Forde
(74) *Attorney, Agent, or Firm* — Knobbe Martens Olson & Bear LLP

(57) ABSTRACT

Apparatus and methods of controlling a frequency-converted diode laser system are disclosed. The diode laser systems can include embodiments of thermally coupled elements facilitating temperature stabilization. Aspects of some methods include monitoring the output of a stabilized diode laser system to reduce noise of the output laser beam. Other aspects of some methods include adjusting the temperature of a frequency converter based on noise in the output beam, and/or the current provided to drive the diode laser. Systems incorporating such control aspects, and others, are also disclosed.

22 Claims, 14 Drawing Sheets

U.S. PATENT DOCUMENTS

| | | |
|---|---|---|
| 2004/0027631 A1 | 2/2004 | Nagano et al. |
| 2004/0210289 A1 | 10/2004 | Wang et al. |
| 2005/0180474 A1* | 8/2005 | Buchold et al. ............ 372/38.08 |
| 2005/0220458 A1 | 10/2005 | Kupershmidt et al. |
| 2005/0281298 A1 | 12/2005 | Kupershmidt et al. |
| 2006/0239317 A1 | 10/2006 | Yoshida et al. |
| 2006/0273260 A1 | 12/2006 | Casstevens et al. |
| 2009/0097507 A1* | 4/2009 | Zhu et al. .......................... 372/6 |

* cited by examiner

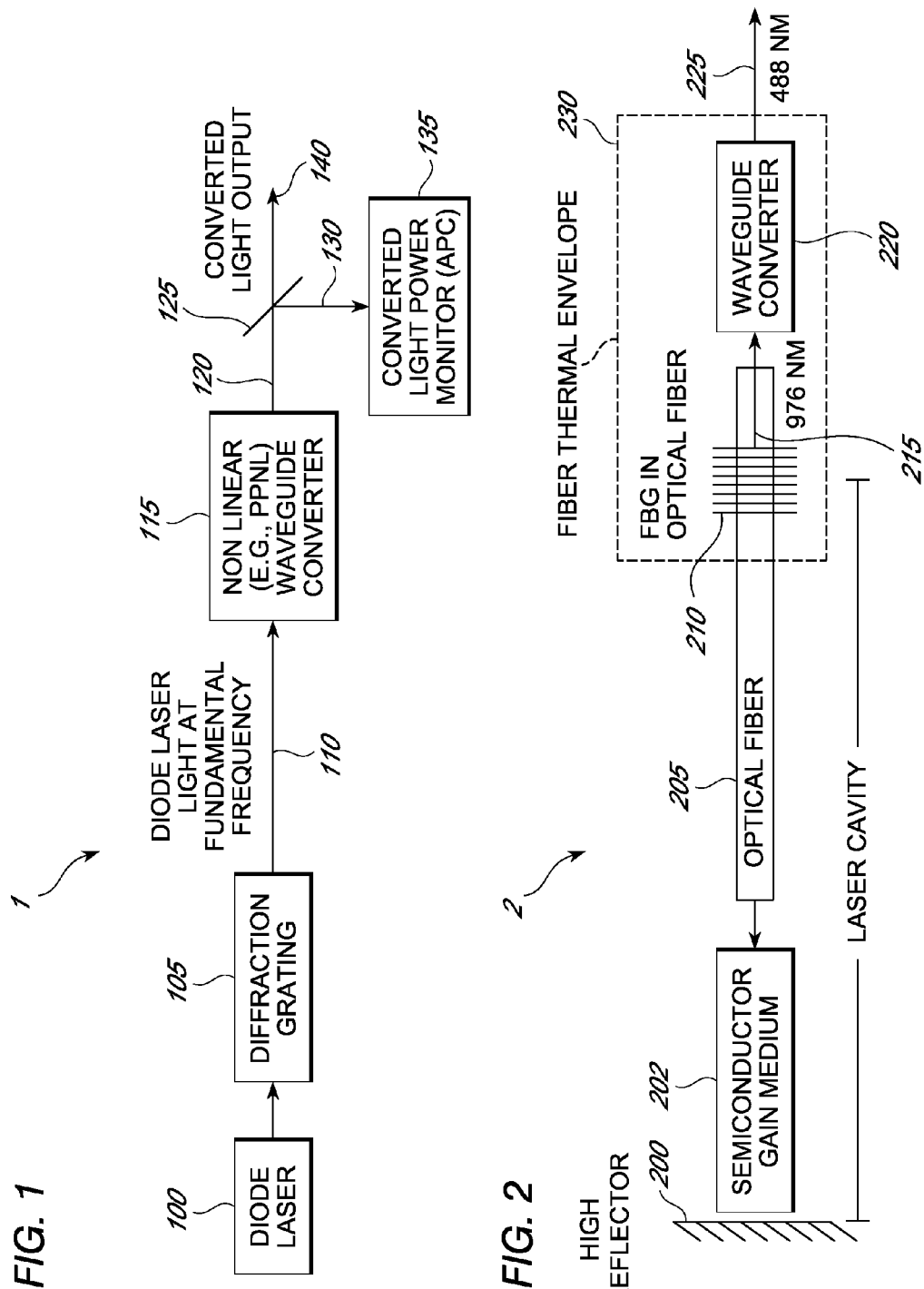

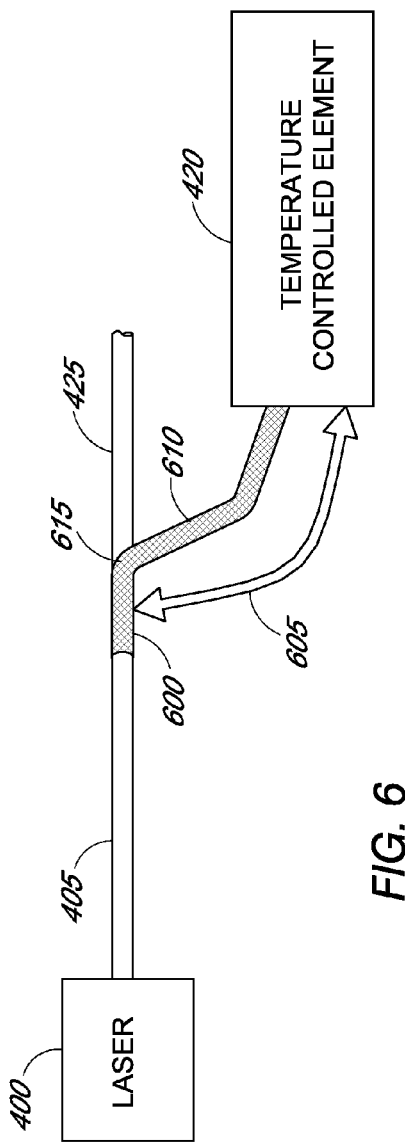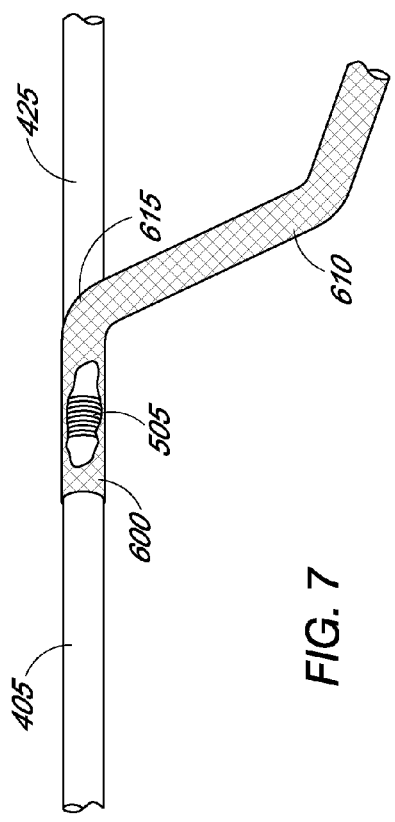

TEMPERATURE CONTROL SYSTEM FOR A FREQUENCY CONVERTED DIODE LASER

RELATED APPLICATIONS

This application is a divisional of U.S. patent application Ser. No. 11/455,223, filed Jun. 15, 2006 now U.S. Pat. No. 7,899,105, which claims the benefit of U.S. Provisional Patent Application No. 60/691,271, filed Jun. 15, 2005, and U.S. Provisional Patent Application No. 60/763,497, filed Jan. 30, 2006, each of which is assigned to the assignee hereof. The disclosures of all the above-referenced prior applications, publications, and patents are considered part of the disclosure of this application, and are incorporated by reference herein in their entirety.

BACKGROUND

1. Field

The present application relates to the field of laser systems, control systems for operating laser systems, and frequency conversion of light from laser diodes. In particular, various embodiments of this invention relate to temperature stabilizing systems, temperature adjusting systems, and control systems in frequency conversion laser systems.

2. Description of Related Technology

Laser diodes are developing great interest as a low cost, highly efficient source of laser light, replacing larger, more costly, and less efficient lasers. However, the available wavelengths directly emitted by diode lasers are limited. Even if a desired wavelength may be achievable, the low output power and/or poor reliability of the diode laser required to emit the desired wavelength can limit its use. In order to meet a variety of different wavelength requirements, there is interest in using diode laser systems that convert the fundamental wavelength emitted by more reliable and powerful laser diodes into the desired typically shorter wavelengths.

For effective wavelength conversion implementations, diode laser systems are typically required to produce a precise wavelength, and often use temperature sensitive nonlinear components which require thermal stability to operate effectively. While current control systems generally regulate beam output by adjusting the current supplied to a diode laser based on a sampled output signal, they do not fully address thermal stabilization issues related to components of a frequency converted diode laser system. Furthermore, such systems do not utilize available control information to adjust the output of the diode laser or thermally control temperature sensitive components. Frequency converted laser systems have a wide range of potential applications. It would be beneficial to the art to improve the performance and stability of these types of system so that their features can be exploited in improving existing products and creating new products that have not yet been developed.

SUMMARY

Each of the inventive apparatuses and methods described herein has several aspects, no single one of which is solely responsible for its desirable attributes. Without limiting the scope of this invention, its more prominent features will now be discussed briefly. After considering this discussion, and particularly after reading the section entitled "Detailed Description" one will understand how the features of this invention provides improvements for temperature stabilizing systems, temperature adjusting systems, and control systems for diode laser systems.

In one embodiment a frequency converted laser system, includes a laser system including a semiconductor gain medium, a first reflective end disposed to form one end of a laser cavity, and an optical medium comprising a Bragg grating optically coupled to receive an optical output of the semiconductor gain medium, the Bragg grating forming a second reflective end of the laser cavity, where the laser system produces a laser beam output at a first frequency, a waveguide comprising a nonlinear element, the waveguide optically coupled with the optical medium to receive the laser beam output of the laser system, the waveguide configured to output a laser beam having a second, different frequency; a temperature controlled element, and a thermal connector connected to the temperature controlled element and coupled to at least a portion of the optical medium having the Bragg grating, the thermal connector configured to thermally couple the temperature-controlled element and the Bragg grating such that the temperature of the Bragg grating is related to the temperature of the temperature controlled element. In some embodiments, the a temperature controlled element comprises a thermo-electric cooler, while in others it can be a housing enclosing at least a portion of the frequency converted laser system. The Bragg grating can be, for example, a volume Bragg grating or a fiber Bragg grating. The thermal connector can comprise an elongated metal structure, including a tube, mesh, can be flexible, and can comprise metal foil, in some instances less than or equal to about 3 mils thick. The thermal connector can also be configured as a metal envelope, e.g., configured to form a cavity enclosing at least a portion of the optical medium. The frequency converted laser system can further comprise a monitoring system optically coupled to monitor the laser beam output by the frequency converter and provide a feedback signal, and a control system connected to the monitoring system, the control system configured to received the feedback signal and to control the output of the laser system by adjusting the current supplied to laser based on the feedback signal.

In another embodiment, a frequency converted laser system includes a laser system configured to produce a laser beam having a first frequency, the laser system comprising an optical medium comprising a Bragg grating, a waveguide comprising at least one nonlinear material, the waveguide being configured to receive an input laser beam of a first frequency from the diode laser system and emit an output laser beam having a second frequency, the second frequency different than the first frequency, a power control system optically coupled with the waveguide and configured to monitor the output laser beam, the power control system being configured to provide a first signal indicative of noise in the output laser beam, and a temperature control system connected to the power control system to receive the first signal. The temperature control system can comprise a first temperature controlled element connected to the waveguide for controlling the temperature of the frequency converter, and a controller configured to control the temperature of the temperature control element, where the temperature control system can be configured to adjust the temperature of the first temperature controlled element to reduce noise in the output laser beam based on the first signal. In various aspects, the power control system is further configured to derive the first signal based on an AC component in the output laser beam indicating a noise level in the output laser beam. Also, temperature control system can be configured to adjust the temperature of the first temperature control element when the first signal indicates the noise level is greater than a predetermined threshold value. In some embodiments, the system can comprise a fiber Bragg grating stabilized laser, and wherein the optical medium comprises optical fiber. In other embodiments, the system comprises an external cavity diode laser, and such a system can comprise a volume Bragg grating.

In another embodiment, a frequency converted laser system includes a laser system configured to produce a laser beam having a first frequency, the laser system comprising an optical medium comprising a Bragg grating, a waveguide comprising at least one nonlinear material, the waveguide being configured to receive an input laser beam of a first frequency from the laser system and emit an output laser beam having a second frequency, the second frequency different than the first frequency, and a power control system optically coupled with the waveguide and configured to monitor the output laser beam, the power control system being configured to provide a first signal indicative of power in the output laser beam, and a diode control system connected to the power control system to receive the first signal, the diode control system configured to control a drive current supplied to drive the laser system based on the first signal, and a temperature control system connected to the diode control system to receive a second signal indicative of the drive current level. The temperature control system can include a first temperature controlled element connected to the waveguide for controlling the temperature of the frequency converter, and a controller configured to control the temperature of the temperature control element, where the temperature control system is configured to adjust the temperature of the first temperature controlled element to reduce the drive current. In one aspect, The temperature control system is further configured to adjust the temperature by changing the temperature of the waveguide in a first direction and observing a change in the drive current as indicated by the second signal, and if a reduction in the drive current is observed then continuing to change the temperature of the waveguide in the first direction until the drive current is below a threshold value, and if a reduction in the drive current is not observed, then adjusting the temperature of the waveguide in a second direction, opposite the first direction, and if an decrease the drive current is observed, then continuing to change the temperature of the frequency converter in the second direction and until the drive current is below the threshold value.

In another embodiment, a method of manufacturing a frequency converted laser system having a laser system that includes a semiconductor gain medium, a first reflective end disposed to form one end of a laser cavity, an optical medium comprising a Bragg grating optically coupled to receive an optical output of the semiconductor gain medium, the Bragg grating forming a second reflective end of the laser cavity, a waveguide comprising a nonlinear element, and a temperature controlled element includes forming a thermal connector around at least a portion of the optical fiber comprising the fiber Bragg grating, the thermal covering configured to transfer heat between the fiber Bragg grating and the thermal connector, and coupling the thermal connector to the temperature controlled element such that thermal conduction occurs between the fiber Bragg grating and the temperature controlled element such that the temperature of the fiber Bragg grating is directly related to the temperature of the temperature controlled element.

In another embodiment, a frequency converted system includes a laser diode system comprising a fiber Bragg grating, and a means for controlling the temperature of the fiber Bragg grating through thermal conduction.

In another embodiment, a method for reducing noise in a laser system having frequency converter, includes monitoring a frequency converted output laser beam, detecting a noise component of the output laser beam, determining a noise value indicative of the noise component, and adjusting the temperature of the frequency converter to reduce the noise value. In one aspect, the adjusting the temperature comprises if the noise value exceeds a noise threshold value, adjusting the temperature of the frequency converter in a first direction and monitoring the change in the noise value, and if the noise value decreases, then continue to adjust the temperature in the first direction until an increase in the noise value is observed, and if the noise value increases when adjusting the temperature in the first direction, adjusting the temperature in a second direction opposite the first direction and monitoring the change in the noise value, and if a decrease in the noise value is observed, then continuing to change the temperature in the second direction until an increase in the noise value is observed.

In another embodiment, a method for operating a frequency-converted diode laser system includes monitoring a laser beam from the frequency converted diode laser system, determining a power value indicative of the output power of the laser beam, providing an amount of current to the laser diode system responsive to the power value such that the provided current amount maintains the output power at a predetermined level, and if the current amount exceeds a threshold value, adjusting the temperature of a frequency converter to reduce the current amount while maintaining the output power at the predetermined level. In one aspect, adjusting the temperature includes changing the temperature of the frequency converter in a first direction and monitoring the change in the current amount, and if a reduction in the current amount is occurs, continuing to change the temperature of the frequency converter in the first direction until the current amount is no longer being reduced, and if a reduction in the current amount does not occur, then changing the temperature of the frequency converter in a second direction, opposite the first direction, and monitoring the change in the current amount and if an decrease in the current amount occurs, then continuing to change the temperature of the frequency converter in the second direction and monitoring the change in the output power until the current amount is no longer reduced.

In another embodiment, a method for reducing noise and efficiently operating a frequency converted laser system, the method includes monitoring a frequency converted laser beam output, monitoring an amount of current provided to drive the laser system to produce the laser beam output, determining an AC component and a DC component of the monitored laser beam output, the magnitude of the AC component being indicative of output noise of the monitored laser beam output, and the DC component being indicative of power of the monitored laser beam output, and adjusting the temperature of a frequency converter responsive to the AC component and the DC component to reduce the output noise of the laser beam output, and to reduce the amount of current.

In another embodiment, a method of operating a frequency converted laser system laser controlled by a power control system that regulates drive current supplied to drive the laser system to produce a laser beam having consistent output power includes storing a first current value indicative of a low amount of the drive current used to produce a laser beam output having a first power level, storing a temperature value indicative of the temperature of a frequency converter while producing the laser beam having the first power level, monitoring a second current provided to the diode laser, determining if a difference between the first current value and the second current exceeds a threshold value, and if the difference exceeds the threshold value, adjusting the temperature of the frequency converter to reduce the drive current while maintaining the first power level of the laser beam output.

BRIEF DESCRIPTION OF THE DRAWINGS

FIG. 1 is a block diagram illustrating a frequency converted laser system.

FIG. 2 is a block diagram illustrating a frequency converted laser system comprising a fiber Bragg grating.

FIG. 6 is a schematic illustrating another embodiment of a thermal connector.

FIG. 7 is a schematic illustrating a cutaway view of the thermal connector shown in FIG. 6.

It is noted that like numerals refer to like parts throughout the several views of the drawings.

DETAILED DESCRIPTION

Figure 3:
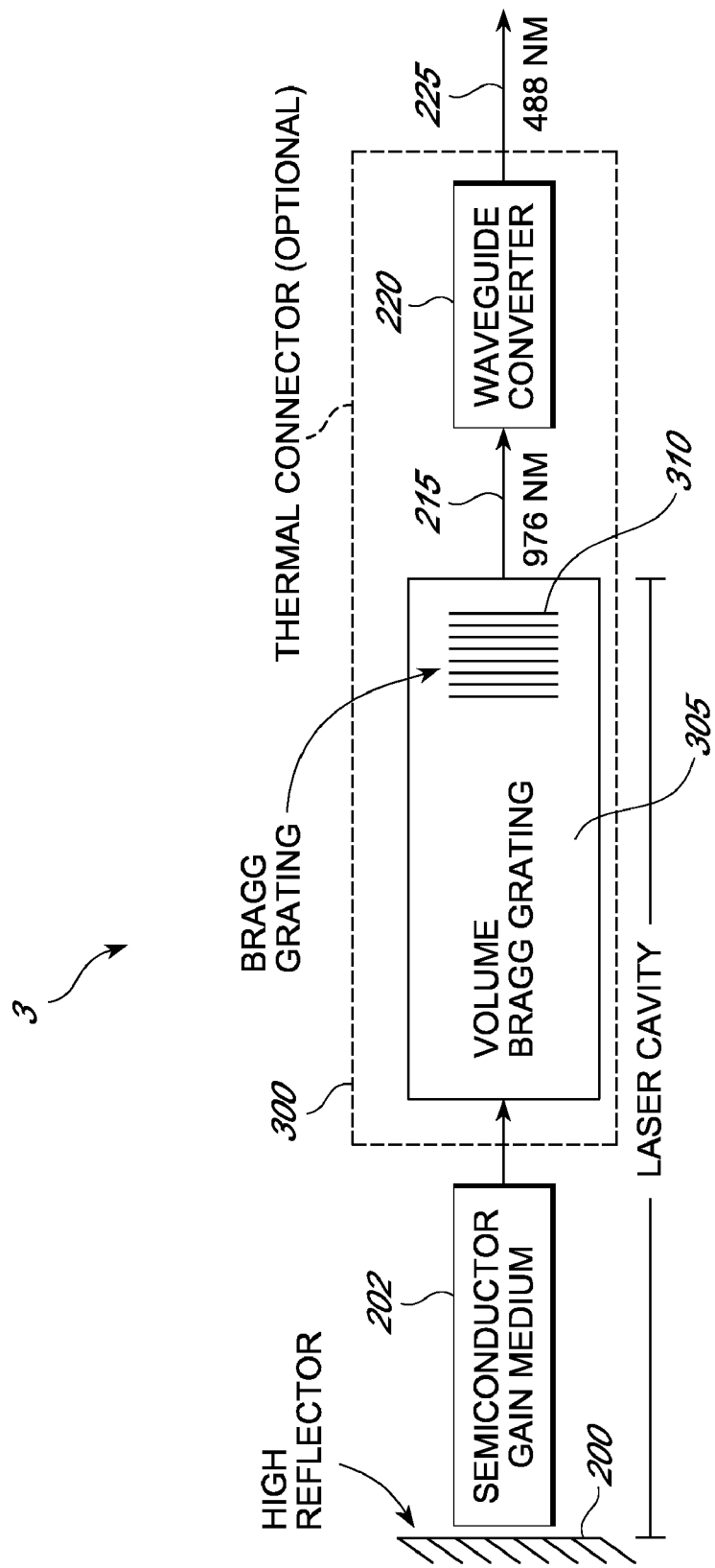
FIG. 3 is a block diagram illustrating a frequency converted laser system comprising a volume Bragg grating.

The following detailed description is directed to certain specific embodiments of the invention. However, the invention can be embodied in a multitude of different ways. Reference in this specification to "one embodiment" or "an embodiment" means that a particular feature, structure, or characteristic described in connection with the embodiment is included in at least one embodiment of the invention. The appearances of the phrase "in one embodiment," "according to one embodiment," or "in some embodiments" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

Some systems, methods and materials for implementing frequency conversion diode systems have been previously developed, but they have not been fully reliable, at least partially because of temperature-control and beam-quality problems. Frequency converted laser systems often exhibit deficiencies in controlling the temperature of heat sensitive components, which affects a laser beam output used for frequency conversion. Thermal stabilization systems and methods have been devised to address such deficiencies in frequency converted diode laser systems. In one aspect, a heat sensitive component (e.g., a waveguide) of a frequency converted laser system can be thermally coupled to a temperature controlled second component (e.g., a laser housing or a thermoelectric cooler) so that the temperature of the heat sensitive component is controlled by the temperature in the other, resulting in improved thermal stabilization. The second component can be temperature controlled by a control system or by ambient conditions. In another aspect, a temperature control system can adjust the temperature of a frequency converter (e.g., a second harmonic generation waveguide comprising a periodically poled lithium niobate material) based on the amount of current used to drive the diode laser to maintain operationally efficient relationship for frequency conversion. In operation, the conversion efficiency control system controls (dithers) the temperature of the XTEC responsive to variations in the diode current, and seeks the temperature that requires the lowest possible diode current to produce a predetermined output power level. Particularly, the temperature control system monitors the diode current that is required to maintain a constant laser output power, and when a large current increase is detected (which means that the output efficiency has dropped), the control system changes the temperature of the XTEC, then monitors the resulting change in the diode current. This way, the XTEC temperature is incrementally adjusted and the results monitored until the lowest diode current is achieved, which means that a high conversion efficiency has been achieved. A temperature control system can also use an AC signal detected in the frequency converted output beam to provide feedback data so that the temperature control system can adjust the temperature of the frequency converter to reduce noise. These and other temperature control processes, and control systems embodying these processes, are described further herein to provide solutions to the above-discussed and other problems in the art.

Herein terms "wavelength" ($\lambda$) and "frequency" (f) may be used interchangeably to characterize one parameter of laser radiation. Wavelength is defined herein as the wavelength in free space, and therefore either term (e.g., either wavelength or frequency) uniquely characterizes the laser radiation in accordance with the relationship $\lambda f=c$, where c equals the speed of light in the medium (herein assumed to be free space).

One example of frequency converted process in a laser system is a frequency doubling process that operates in a frequency converter having a non-linear material (e.g., crystal), such as periodically poled lithium niobate ("PPLN"), where the output beam frequency is doubled and the wavelength halved. One such example is a PPLN diode laser that emits a laser beam of 976 nm to a second harmonic generation waveguide converter which produces a converted laser beam having a wavelength of 488 nm. A waveguide converter is a type of frequency converter, and, as used herein is a broad term, and is to be given its ordinary and customary meaning to a person of ordinary skill in the art (and is not to be limited to a special or customized meaning), and furthermore refers without limitation to a waveguide made of a nonlinear material, configured for frequency conversion. To provide efficient frequency doubling in the nonlinear material, the fundamental wavelength (e.g., 976 nm) of the input beam should closely match the design wavelength of a nonlinear material used in the frequency converter, and the spectral linewidth or spectral beam quality of the input beam should be relatively narrow (e.g., substantially within a narrow range of frequencies), within or close to the spectral acceptance of the nonlinear process. Some embodiments of such systems comprise a semiconductor laser having a reflective diffraction grating (e.g., a fiber Bragg grating 'FBG' or a volume Bragg grating) that provides a narrow spectral width of laser feedback into a semiconductor gain medium, which causes the laser to lase with a center wavelength defined by the wavelength corresponding to a peak of the Bragg grating reflectivity. Likewise, the spectral width of the laser is determined by the spectral width of the grating.

FIGS. 1-3 illustrate some examples of frequency converted diode laser systems which can incorporate one or more of the inventive aspects described herein, however, the inclusion of such aspects in frequency converted diode laser systems are not limited to these systems. FIG. 1 is a block diagram illustrating a frequency conversion diode laser system 1 comprising a diffraction grating 105. The diode laser system 1 includes a diode laser 100 the output laser light of which is directed through the diffraction grating 105. The laser light 110 emitted from the diffraction grating 105 is at a fundamental frequency and is directed at a nonlinear waveguide converter 115 which comprises a nonlinear material, such as PPNL. In some embodiments, the diffraction grating is a fiber Bragg grating or a volume grating, as illustrated in FIGS. 2 and 3, respectively. The converted-frequency light 120, is sent through a beam splitter 125 (e.g., a pick-off reflector) where a portion of the beam 130 is directed to a converted light power monitoring system 135. The monitoring system is configured to sense the output beam and provide one or more signals related to the output beam for use in controlling the diode laser system 1. For example, the monitoring system 135 can be an automatic power control (APC) system that senses the power of the output beam and provides a signal indicative of the output power to a diode control system (not shown) that controls the output of the diode laser 100 by regulating the current used to power the diode laser. The rest of the frequency converted output beam 140 can be provided for additional output beam adjustments by other optical systems or can be directed to a particular application.

FIG. 2 is a schematic view of another configuration of a frequency converted diode laser system 2 that can incorporate one or more of the thermal stabilization and system control aspects described herein. System 2 includes a semiconductor gain medium 202 and a high reflector 200 disposed on one side or surface of the gain medium 202 to form one end of a laser cavity of the diode laser. An optical fiber 205 is optically connected to the gain medium 202, on a side of the gain medium 202 opposite of the reflector 200, to receive light from the gain medium 202. Light entering optical fiber 205 propagates through the fiber to a fiber Bragg grating 210 formed in optical fiber 210. The FBG 210 forms the other end of the laser cavity. Light 215 passing through the FBG 210 has a frequency (e.g., 976 nm). The light 215 then is directed to a waveguide converter 220, optically coupled to optical fiber 205, which converts the first frequency (and the corresponding wavelength) of the input light 215 to an output light beam 225 (a laser beam) having a second frequency which is different than the first frequency and also having a different wavelength (e.g., 488 nm). A thermal connector (e.g., a thermal connector configured as a jacket or a mesh structure) illustrated here as a fiber thermal envelope (FTE) 230, a type of jacket thermal connector, can be used to thermally couple at least a portion of optical fiber 205, including the portion of the optical fiber containing the fiber Bragg grating 210, and the waveguide converter 220. A thermal conductor configured as an "envelope" comprises a structure that has in outer portion that at least partially encloses a cavity, into which one or more components (e.g., Bragg grating, waveguide) can be positioned. The envelope typically comprises metal (e.g., copper) and can be configured to isolate a component in the cavity from undesired thermal radiation and thermal conduction from one or more other components, and can also be configured to allow the temperature of the envelope to be controlled by a temperature controlled element, for example, a thermo-electric cooler or a portion of a housing that contains the laser system. Thus, the envelope can be made to exclude the influence of the temperature of one component from another component. In some embodiments, the envelope comprises a double layer of material that forms an insulating layer of air around at least a portion of the envelope. In some embodiments, the envelope comprises an insulator coated on least a portion its surfaces (e.g., inside, outside). Other aspects of such envelopes are described hereinbelow in reference to FIGS. 3-5.

In some embodiments, all or substantially all of the optical fiber 205 can be surrounded (either partially or completely) by the FTE 230. The FTE 230 thermally couples the waveguide converter 220 and at least a portion of the optical fiber 205 that includes the FBG 210 so that the temperature of their ambient environment rises or falls together, and if the temperature of the FTE 230 is controlled (e.g., by being thermally coupled to a temperature controlled element) then the temperature of the FBG 210 and the waveguide converter 230 are correspondingly controlled, as described further below in reference to FIGS. 4 and 5. In some embodiments, only one of the FBG 210 or the waveguide converter 220 are contained in the FTE 230 and coupled to a temperature controlled element. Output light 225 emitted from the waveguide converter 220 can be provided for additional output beam adjustments by other optical systems or can be directed to a particular application.

FIG. 3 is a schematic view of another example of another frequency-converted diode laser system 3, that includes a semiconductor gain medium 202 and a high reflector 200 disposed on one side or surface of the gain medium 202 to form one end of a laser cavity of the diode laser. In system 3, an optical medium 310 (e.g., glass or a polymer) is optically coupled to the gain medium 202 to receive emitted light at a volume Bragg grating 310 which forms the other end of the laser cavity. Light from the volume Bragg grating 310 is of a fundamental wavelength (e.g., 976 nm) and is directed to a waveguide converter 220, which produces light having a different frequency and wavelength (e.g., 488 nm). A thermal connector 300 (e.g., a metal jacket or a metal mesh) thermally couples the volume Bragg grating 310 and the waveguide converter 215, so that their respective temperatures are related, providing thermal stabilization of the coupled components. Output light 225 emitted from the waveguide converter 220 is provided for additional output beam adjustments by other optical systems or can be directed to a particular application. In some embodiments, the thermal connector 300 thermally couples only one of the volume Bragg grating 310 or the waveguide converter 220. The thermal connector 300 can be thermally coupled (e.g., mechanically attached to) a temperature controlled element (not shown) to control the temperature of the components coupled thereto.

Waveguide converters, such as the examples illustrated in the systems of FIGS. 1-3, are available in many configurations and can have different operating characteristics and temperature sensitivities. A waveguide converter, (also can also be referred herein as a "waveguide") is a type of "frequency converter" configured in a way to restrict propagating light within a narrow channel and comprises a nonlinear material. In one example, a doubling waveguide is configured for second harmonic generation (SHG) and is made of PPLN or other nonlinear materials such as PP:MgO:LN, PP:MgO:LT, PP:KTP, PP:SLN, and PP:SLT. Waveguides can operate to efficiently double the frequency of light; however, the frequency of the input beam should be within a narrow range of wavelengths. For example, the spectral acceptance (i.e., the range of wavelengths that will convert efficiently) is about 0.12 nm in one nonlinear SHG waveguide.

Temperature can affect many of the components of a diode laser system, including the waveguide, the optical fiber, and the Bragg grating. Because a fiber Bragg grating wavelength can change at 0.007 nm/° C., and the ambient (operating) temperature can vary widely (e.g., from about 10° C. to 55° C.) the output wavelength of a FBG stabilized diode laser can change outside a SHG waveguide spectral acceptance when the ambient temperature changes. For example, if the temperature of a waveguide is adjusted for maximum second harmonic generation with a fiber Bragg grating at 20° C., and then if the ambient temperature for the FBG is changed to 55° C., the output wavelength can shift by 0.245 nm (i.e., 0.007 nm/° C.*35° C.), which is significantly outside the second harmonic generation band of the waveguide. As a result, the second harmonic generation power will drop, sometimes dramatically, as the ambient temperature changes. In addition, if the peak wavelength produced by a laser shifts (e.g., as a function of the fiber Bragg grating temperature) so that it is no longer aligned to the optimum phase-matched wavelength of the nonlinear material, the second harmonic generation output of the waveguide becomes more sensitive to small wavelength fluctuations in the laser, thereby increasing the amount of noise in the second harmonic output of the waveguide.

Several vendors in the telecom space have developed single-mode lasers, some stabilized by a fiber Bragg gratings formed in an optical fiber such as those used for pumping an erbium-doped fiber amplifier (EDFA), and those that can also be used as pump sources for fiber amplifier technologies. These devices have traditionally been able to deliver up to a few hundred milliwatts out of a single mode fiber around 980 nm. One example of a stabilized FBG laser is the Power-Pure™ series of high power 980 nm pump modules manufactured by Avanex of Fremont, Calif. and Erwin Park, N.Y. (lasers are manufactured in Nozay, France), which are specified to have a relatively high power (up to 300 mW at 976 nm) with a spectral linewidth less than 1 nm. The output from a single mode diode chip is coupled into a polarization-maintaining fiber pigtail. Approximately 925 mm from the input facet, a fiber Bragg grating is written into the fiber. The FBG selects, stabilizes and narrows the wavelength spectrum from the diode chip. The spectral output has some temperature sensitivity, as the center wavelength (defined by the feedback from the FBG) tunes relatively slowly (about 0.02 nm/° C.). While the specification on the spectral bandwidth is somewhat large relative to the requirements for efficient SHG in periodically-poled materials (typical FWHM acceptance bandwidth for PPLN is ~0.12 nm-cm), the typical bandwidth observed is significantly less than 1 nm. By using FBGs that have narrower bandwidth, spectral outputs of less than one hundred picometers (<100 pm) can be achieved.

The materials typically used for the fiber pigtails into which FBGs are written have a temperature-dependent index of refraction (i.e., their index of refraction changes as a function of temperature). Because the underlying principle of the Bragg grating's spectral reflectivity is a function of the index of refraction of the material, the peak reflectivity (wavelength) of the FBG is also a function of temperature. Similarly, the materials used for volume Bragg gratings have a temperature-dependent frequency selectivity. Because the nonlinear frequency conversion process has a finite spectral acceptance bandwidth, the wavelength drift associated with temperature tuning of the peak spectral reflectivity of the BG can cause the pump radiation to fall outside the acceptance band of the nonlinear crystal.

Figure 4A:
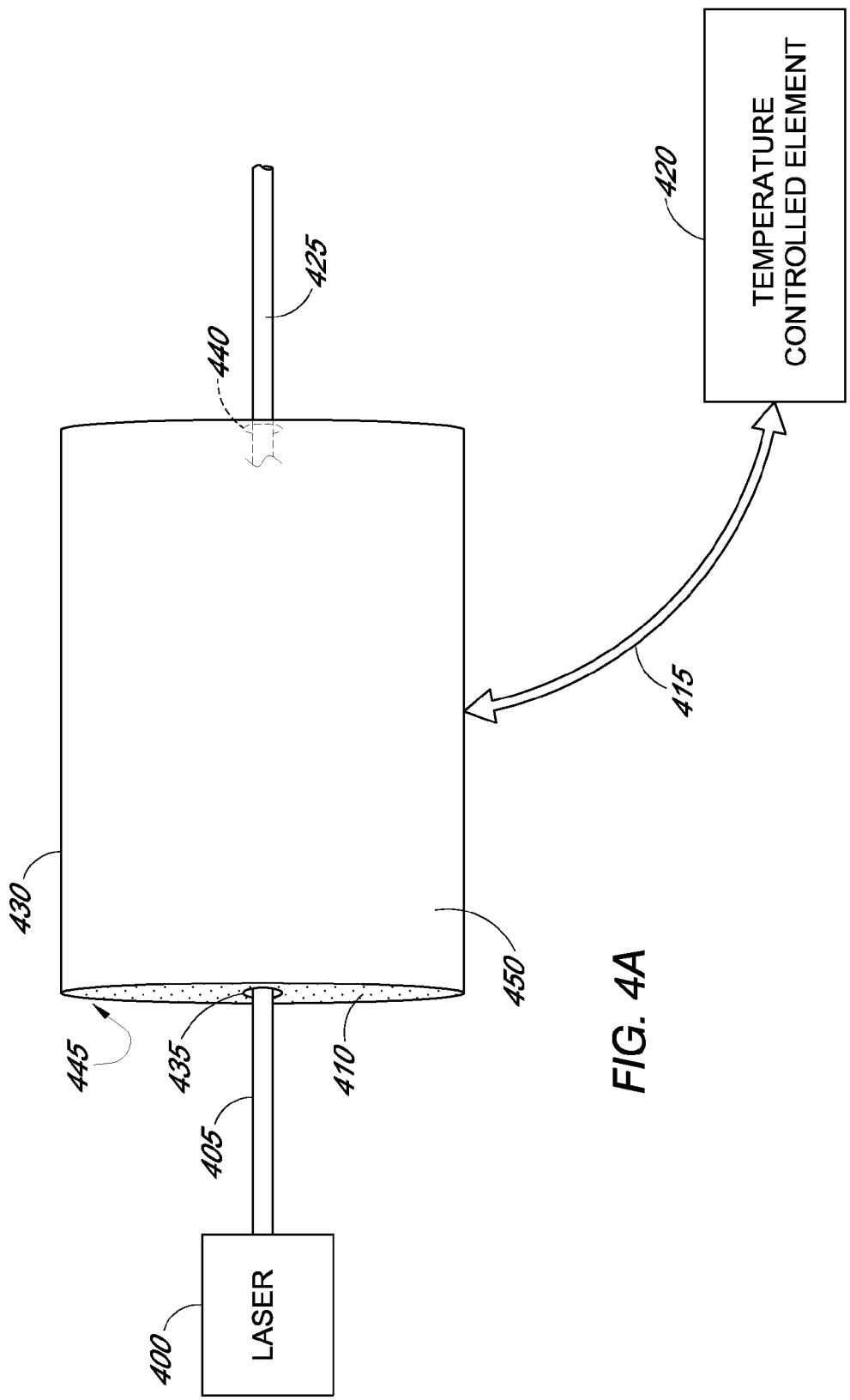
FIG. 4A is a schematic illustrating an thermal connector.
Figure 4B:
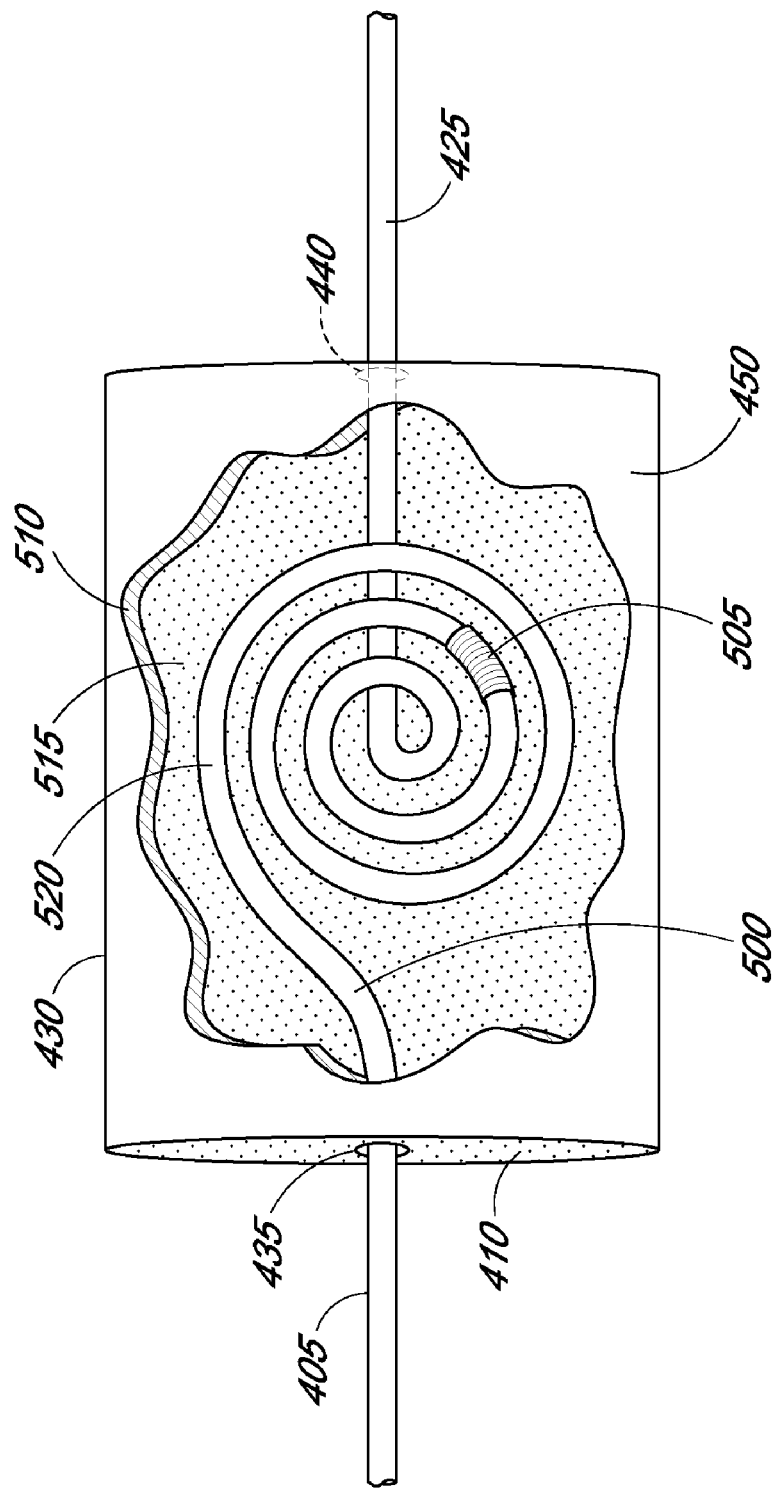
FIG. 4B is a schematic illustrating a cutaway view of the thermal connector shown in FIG. 4A.

Various embodiments of thermally coupled and/or temperature-adjusting systems have been developed to address temperature control/stabilization issues in frequency converted laser systems. FIGS. 4A, 4B, 5A, 5B, and 6-7 depict some embodiments of thermal connectors that can be connected to a component of a frequency converted laser system and a temperature controlled element (TEC) to thermally couple the component and the TEC to control or stabilize the component. In some embodiments, the thermal connector couples at least a portion of an optical medium having a Bragg grating to a TEC, the thermal connector being configured to thermally couple the TEC and the Bragg grating such that the temperature of the Bragg grating is related to the temperature of the TEC. For example, FIG. 4 is a schematic illustrating a portion of a frequency converted laser system that includes a laser 400 (e.g., a fiber Bragg grating stabilized laser, another type of semiconductor laser) optically coupled to a optical fiber 405. A fiber Bragg grating (not shown) is formed in a portion of the optical fiber 405. In this embodiment, a thermal connector 430 is configured as a fiber thermal envelope (FTE) (one type of "thermal connector") and designed to maintain a portion of or the entire fiber pigtail including the fiber Bragg grating at a near-constant temperature. In some embodiments, a volume Bragg grating is surrounded by FTE 430. The FTE 430 is configured such that it surrounds at least a portion of the optical fiber 405, including the portion containing the fiber Bragg grating, in a cavity FTE 430 can include a top surface 450, a bottom surface 445, and side or end surfaces 410 and 445.

Optical fiber 405 passes into the cavity formed in the FTE 430 through an entrance aperture 435 formed in end surface 435. Optical fiber 405 passes out of FTE 430 through exit aperture 440 formed in end surface 445, and then typically is optically coupled to a waveguide converter (not shown) or another optical element in the frequency converted laser system. Entrance aperture 435 and exit aperture 440 can be disposed on any portion of FTE 430. In some embodiments, the entrance aperture 435 is the same as the exit aperture 440. In some embodiments, the FTE 430 surrounds substantially all of optical fiber 405. In some embodiments, FTE 430 surrounds a portion of optical fiber 405 and the fiber Bragg grating but may not completely enclose the optical fiber. The FTE 430 isolates any components contained therein from direct contact with other structures and ambient conditions outside of the envelope to maintain the components at the same temperature. The FTE 430 is in thermal contact 415 with a temperature controlled element 420 (e.g., a laser housing assembly, a diode TEC, or a waveguide TEC). The thermal contact can be through direct mechanical contact between the TEC 420 and a portion of the FTE 430, or through another thermal couple structure configured to allow thermal conduction between the FTE 430 and the TEC 420. In some embodiments, the temperature controlled element 420 is contained within the FTE 430.

FIG. 4B illustrates the thermal connector shown in FIG. 4A with a cutaway view in the surface 450 showing a portion of optical fiber 500 and a FBG 505 surrounded by the FTE 430.

Optical fiber 500 is typically formed into a loose coil 520 to avoid inducing strain. In some embodiments the FTE 430 comprises thin metal (e.g., foil) having a thickness 510 of about 30 mils or less, that is flexible such that it can easily be formed into a desired structure. Thicker metal can also be used. In some embodiments, the metal is equal to or less than less than 3 mils thick. The FTE 430 can comprise copper, silver, gold, aluminum, alloys thereof, or other materials with good heat conduction properties. The thickness of the various portions of the FTE can vary. For example, in some embodiments a portion of the FTE that is placed in contact with the TEC can be comprise thicker material to form a base-plate, as discussed in reference to FIGS. 5A and 5B below. In some embodiments, a portion of the FTE 430 that is not connected to a TEC can comprise an insulator such that most or all of thermal conduction occurring in the FTE 430 occurs through the portion connected to the TEC 420.

Figure 5A:
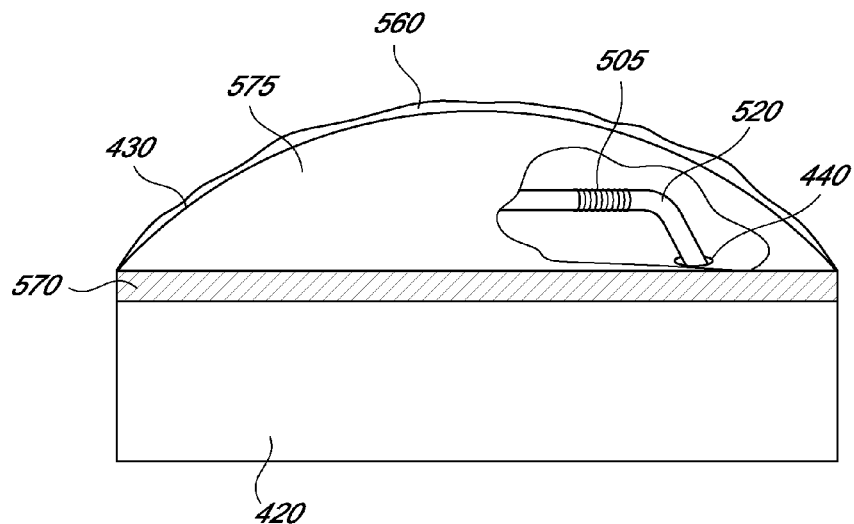
FIG. 5A is a diagram illustrating an embodiment of an thermal connector in side view.
Figure 5B:
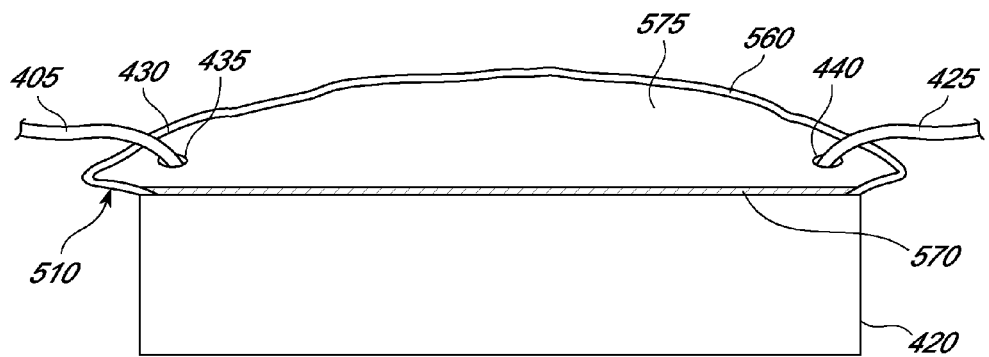
FIG. 5B is a diagram illustrating another embodiment of an thermal connector in side view.

FIGS. 5A and 5B illustrate embodiments of a thermal connector FTE 430 connected to a TEC 420. In FIG. 5A, FTE 430 comprises a base portion 570 and a jacket portion 575 that is connected to the base portion 570 along its perimeter. Base portion 570, configured to be thicker than the jacket portion 575, is positioned in thermal contact with the TEC 420 such that heat transfer can occur through thermal conduction. In this embodiment, the jacket portion comprises a metal foil, typically approximately 0.002" to 0.005" thick. The base plate 570 can be at least slightly thicker metal, typically approximately 0.032" thick. The base plate provides mechanical stability, while simultaneously providing enough thermal mass to allow the FTE 430 to adequately control the fiber pigtail temperature (i.e., act as an oven). By enclosing the entire (or most of the) fiber pigtail in the FTE 430 the polarization ratio or polarization orientation sensitivity due to temperature fluctuations of the pigtail may also be reduced. If thin copper foil is used to form the jacket portion 575, then the thermal mass of the oven is also low, implying that the TEC 420 will not draw significantly more power in order to maintain temperature. In some embodiments, the FTE 430 also comprises an insulator 560 covering all (or a portion of) the jacket portion 575 to insulate the FTE 430 from ambient conditions and so that most, if not all, of the heat transfer occurring with the FTE 430 occurs through the base plate 570. FIG. 5B illustrates another embodiment of an FTE 430 comprising a jacket portion 575 attached to a base plate 570. In this embodiment, the base plate 570 is the same or approximately the same thickness as the jacket portion 575, which may have manufacturing benefits.

In some embodiments, an FTE 430 is placed into good mechanical contact (with low thermal resistance) with a laser system housing, itself made of a good thermally conducting material (e.g., copper). FTE 430, therefore, in some embodiments can be maintained at a similar temperature as the housing (which can be used to maintain a nonlinear crystal at constant temperature), without requiring additional TECs or control loop electronics.

FIGS. 6-7 depict mesh thermal connector embodiments that can be used in frequency converted laser systems. In each of these embodiments the output of a laser 400 is directed through an optical fiber 405. The optical fiber 405 is shrouded (in part or in full) by a mesh thermal conductor 615, which is constructed of a material known to conduct heat. Various types of metals, for example, copper, gold, silver, iron, aluminum, and alloys thereof can be used to form the mesh thermal conductor 615. The mesh thermal conductor is arranged such that it substantially covers the FBG 505 formed in the optical fiber 405. In some embodiments, a portion of the mesh 600 is braided around the optical fiber 405 such that another portion of the mesh 610 can "tail off" of the optical fiber 405 and be connected to a TEC 420. In some embodiments, the tail of the mesh 600 connects directly to a temperature controlled element 420. In other embodiments, a separate thermal connection 605 comprising a heat conductive material (e.g., copper) connects the mesh thermal conductor 600 and the temperature-controlled element 420.

A thermal connector can comprise any type of heat conducting material. Copper is particularly suited to the task of creating a thermal connector for a variety of reasons: Copper has a relatively high thermal conductivity (400 W/m-K), thereby providing a good thermal path to the cold plate. Copper mesh is flexible/conformal; it can be bent easily, minimizing mechanical stress in applications wherein the fiber must be bent or curled. It also allows the "tail" of the mesh to be woven within the laser head package to the cold plate. The mesh architecture allows the fiber to be woven through the side so that only the FBG section is surrounded by it. While the copper mesh can provide a good thermal path from the FBG section to the cold plate, the thermal mass of the mesh is relatively low; this allows for the temperature of the FBG section to be stabilized while not imparting a large thermal load on the TEC. Copper mesh is widely available from many different vendors, making it a very inexpensive solution.

Figure 8:
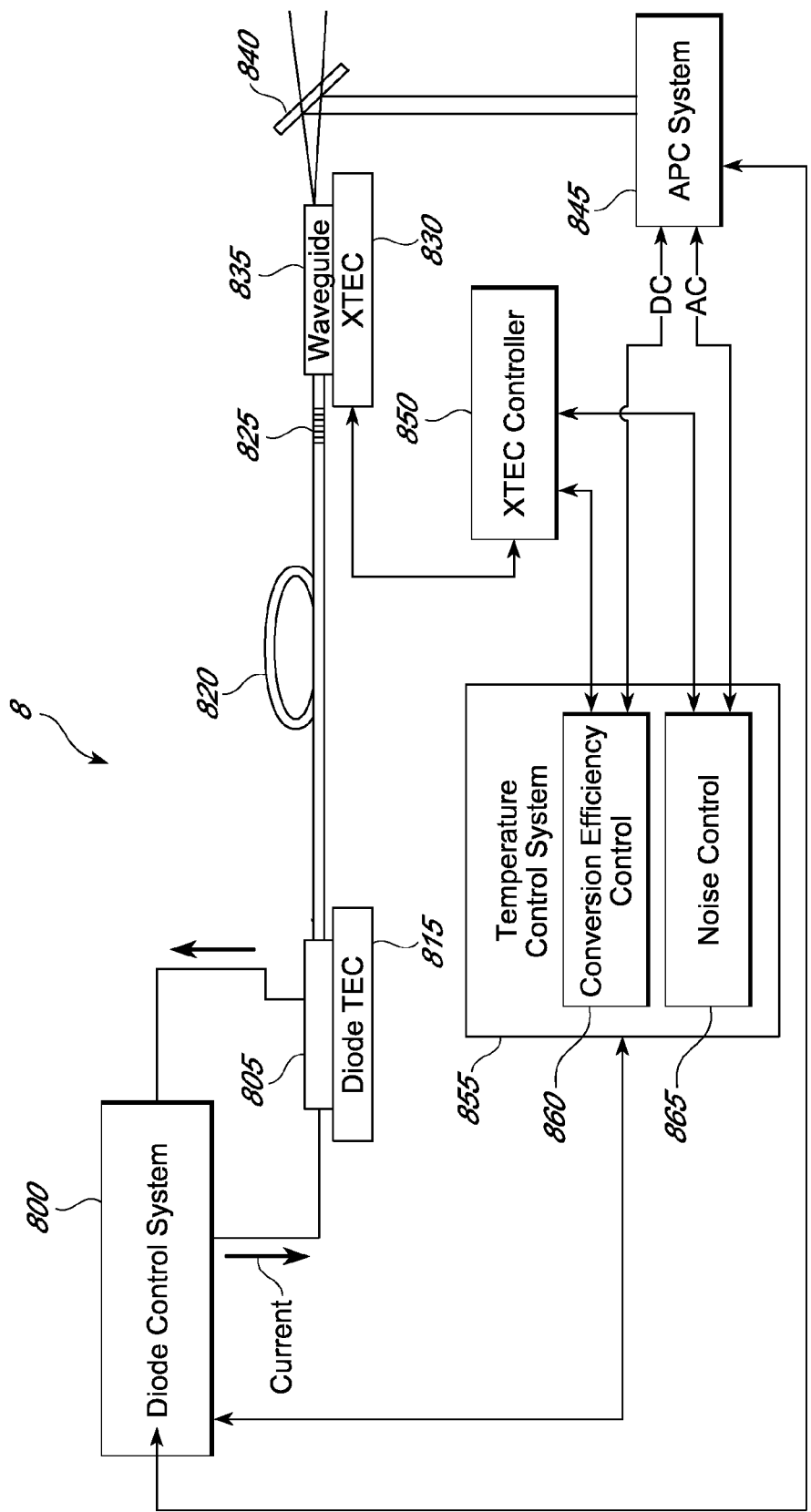
FIG. 8 is a block diagram illustrating a frequency converted laser system that includes a noise control system and a conversion efficiency system.

A temperature control system can also be used to adjust a component of a frequency converted laser system to compensate for temperature changes during operation, for example, as illustrated in the fiber Bragg grating stabilized laser system 8 of FIG. 8. System 8 comprises a diode control system 800 that provides current to drive a semiconductor gain medium 805. A diode TEC 815 is thermally connected to the semiconductor gain medium to maintain it at a desired temperature during operation. System 800 further comprises an optical fiber 820 optically coupled to receive optical output from the semiconductor gain medium 805. The optical fiber 820 includes a fiber Bragg grating 825 formed therein. Although not shown in FIG. 8, at least a portion of the optical fiber 820 can be connected with a thermal connector to a TEC, for example, TEC 815 or TEC 830, discussed below.

The optical fiber 820 is also optically coupled to a waveguide 835 (e.g., a PPLN SHG waveguide) which receives a laser beam emitted through the fiber Bragg grating having a first frequency and converts it to a second, different frequency. A temperature controlled element (XTEC) 830 can be placed in thermal contact with the waveguide 835 (a temperature sensitive component) to adjust the temperature of the waveguide during operation of the laser system. A beam splitter 840 directs a portion of a laser beam output emitted from the waveguide 835 to an automatic power control system 845 that monitors the laser beam output and provides feedback to the system based on detected characteristics of the beam. In some embodiments, additional optical components can be placed between the waveguide 835 and the beamsplitter 840, and the system 800 can include other components not shown. For example, an anamorphic system comprising a set of prisms aligned to receive the beam from the collimator at an angle of incidence at or near Brewster's angle, and transform the elliptical beam into a more circular beam, where each prism has an input surface and an exit surface, and where at least one of the input surfaces is coated with a polarization selective coating. In some embodiments, the input surface of at least one of the prisms is positioned such that an angle of incidence of an input laser beam is within a range of about plus or minus two degrees of Brewster's angle. The polarization selective coating can comprise one or multiple layers (films) that affect polarization. In some embodiments, the coating comprises multiple quarter-wave or half-wave films. In some embodiments, the polarizer is configured such that an exit beam produced by the polarizer has a polarization ratio of 100:1 or greater, while in some embodiments the polarization ratio is 500:1 or higher. In such embodiments, the system can also include a collimator to collimate light from the waveguide 835 before it enters the polarizer. Such embodiments are further described in U.S. application Ser. No. 11/451,623, filed Jun. 12, 2006, issued as U.S. Pat. No. 7,646,546 on Jan. 12, 2010, titled "Anamorphic Optical System Providing a Highly Polarized Laser Output" which is incorporated by reference in its entirety herein.

In some embodiments, the APC system 845 is configured to identify a DC component and an AC component in the monitored laser beam. The DC component indicates the average output power of the laser beam. The AC component indicates noise in the laser beam. The APC system is connected to two control systems, the diode control system 800 and a temperature control system 855. The temperature control system 855 includes a conversion efficiency control system 860 and a noise control component 865. Generally, the conversion efficiency control 860 adjusts the waveguide 835 temperature to improve conversion efficiency, and the noise control system 865 adjusts the waveguide 835 temperature to reduce noise. In some embodiments, a frequency converted laser system can include either of the 860 or the noise control 865. In system 800 shown in FIG. 8, the temperature control system 855 attempts to find an optimal balance between diode efficiency and output noise using the conversion efficiency control 860 and the noise control 865, respectively.

The APC system 845 is configured to provide the conversion efficiency control 860 and the noise control 865 systems with signals indicative of either one or both of the output power level and the noise of the monitored laser beam. The temperature control system 855 is connected to a XTEC controller 850 that controls the temperature of the XTEC 830 and, through thermal conduction, the waveguide 835.

The temperature control system 855 is also connected to the diode control system 800, which maintains the power output of the waveguide output laser beam at a constant level by adjusting the current provided to drive the laser based on the signal indicative of the output power provided by the APC system 845. In turn, the diode control system 800 provides a signal indicative of the current used to drive the diode laser to the temperature control system 855.

With this input value, the conversion efficiency control 860 adjusts the temperature of the XTEC controller 850 to optimize the system 800, changing the temperature of the XTEC to reduce the amount of current required to produce a stable output beam. In some embodiments, at least one previously received drive current value is stored in the temperature control system, the stored value being a low current value that was sufficient to produce the desired output power. A subsequently received current drive value is compared with the stored value to determine if the drive current has exceeded a certain threshold value (e.g., 5, 10, or 15% of the stored low current value.) If the threshold is exceeded, the conversion efficiency control 860 adjusts the temperature of the waveguide 835 by adjusting the temperature of the XTEC 830, first one way and if the drive current is not lowered, than the other way, until the drive current is reduced. This process is described further below in reference to FIGS. 9-11.

Noise control 865 receives a signal from the APC system 845 indicative of the noise in the output beam, and based on that signal, reduces the amount of noise in the laser output by adjusting the temperature of the waveguide 835. In some embodiments, at least one previously received noise value is stored in the temperature control system, the stored value being a low noise value. A subsequently received noise value is compared with the stored value to determine if the noise has exceeded a certain threshold value (e.g., 5, 10, or 15% of the stored low current value.) If the threshold is exceeded, the noise control 865 adjusts the temperature of the waveguide 835 by adjusting the temperature of the XTEC 830, first one way and if the noise is not lowered, than the other way, until the noise is reduced. This process is described further below in reference to FIGS. 9 and 12.

Flowcharts of control processes that can be implemented in a temperature control system of a frequency converted diode laser, where the temperature control system includes a conversion efficiency control system and a noise control system (for example, as shown in FIG. 8) are shown in FIGS. 9-12. Particularly, FIGS. 9-12 illustrate an implementation of a control system operation process 9 (FIG. 9) that uses an initial laser-on XTEC temperature scan process 10 (FIG. 10) to set an initial laser drive current value, and then operates a laser system using a conversion efficiency process 11 (FIG. 11) and a noise control process 12 (FIG. 12) to improve the laser operating in an automatic power control mode.

Figure 9:
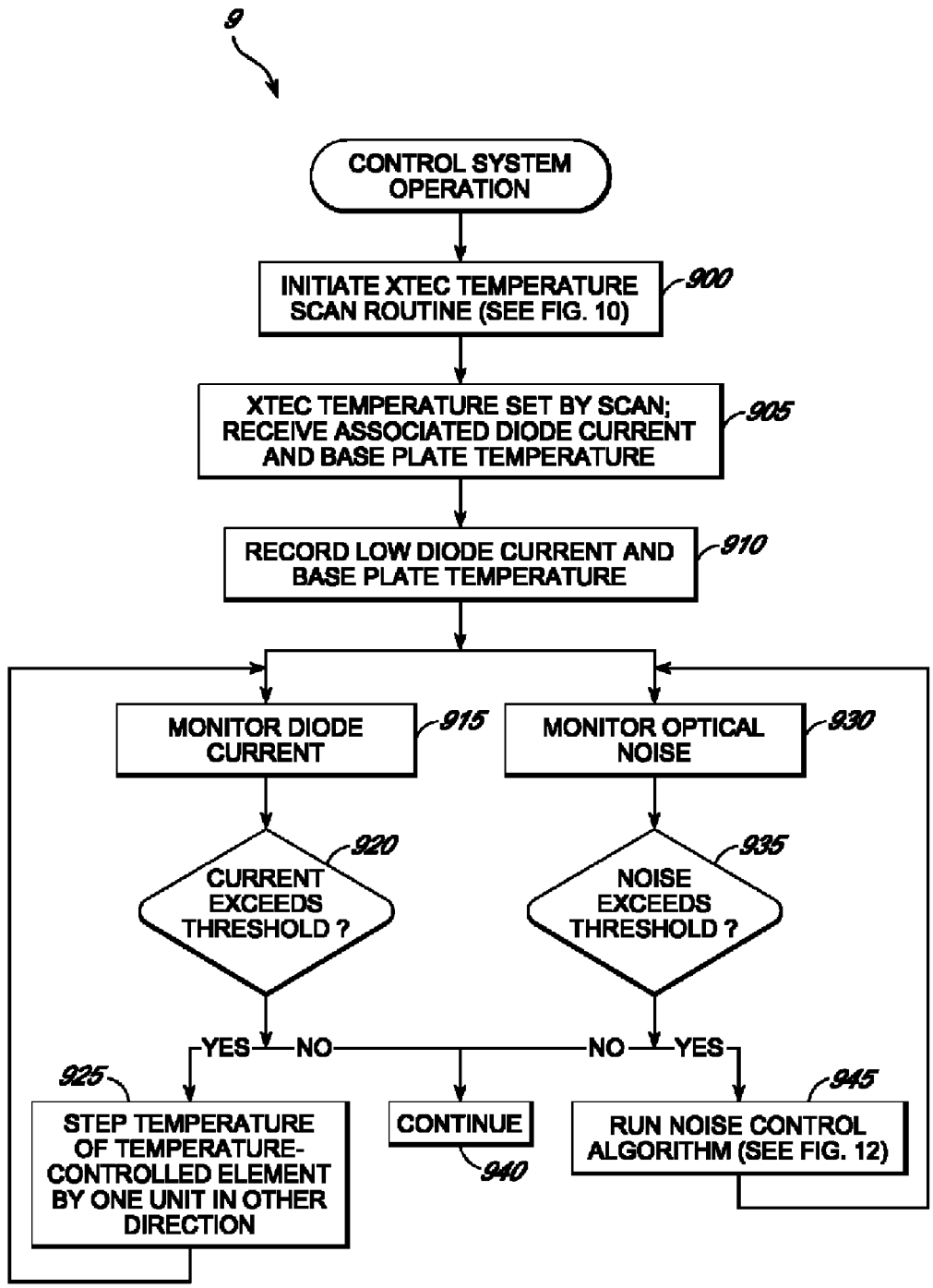
FIG. 9 is a flow diagram illustrating a control process for a laser system.
Figure 10:
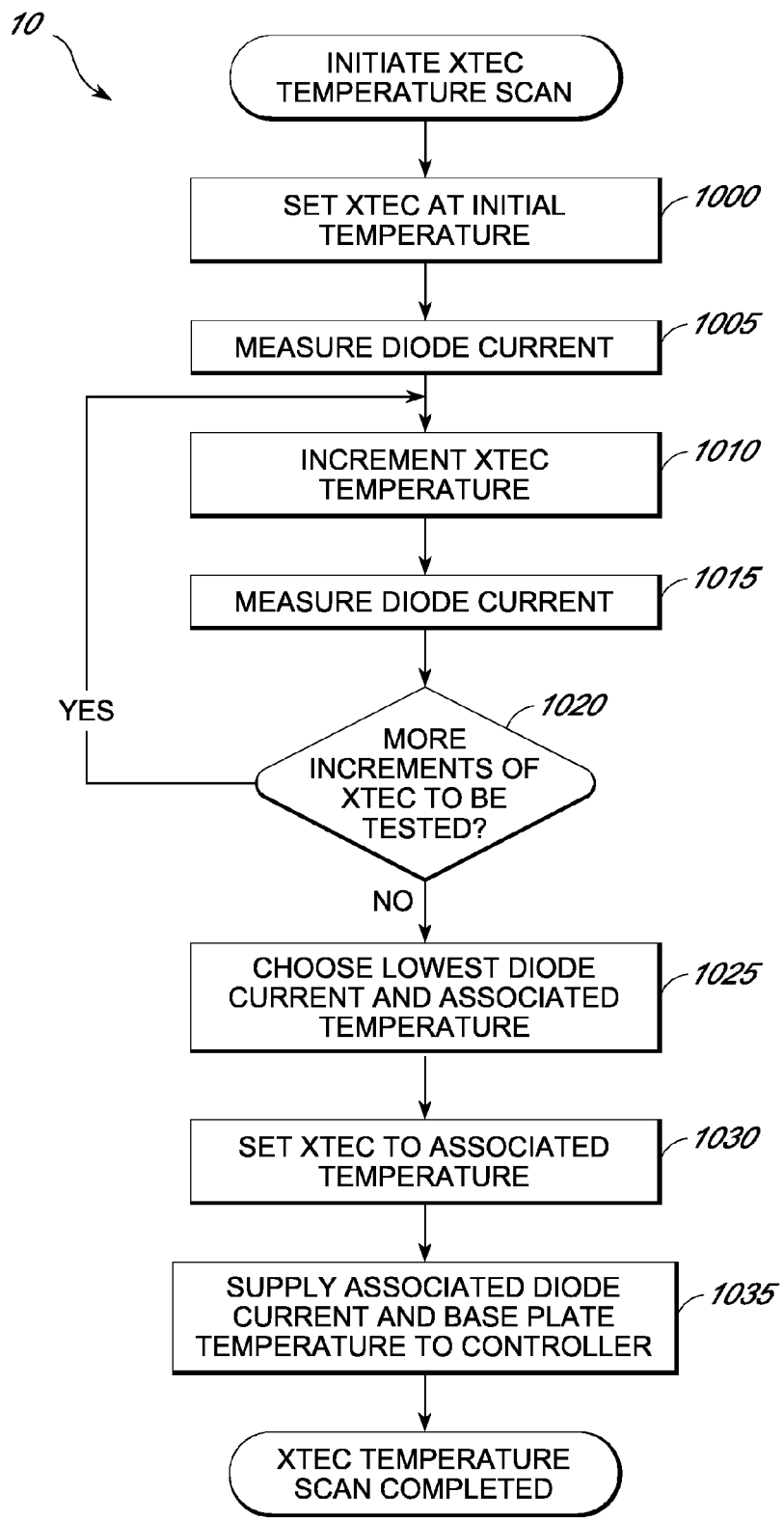
FIG. 10 is a flow diagram illustrating a temperature scan process for a laser system.

Generally, to power up the laser system, lasing is initially disabled, and the TECs (the diode TEC, and the XTEC) are enabled. Referring to FIG. 9, the control system process 9 begins at state 900 by initiating the XTEC temperature scan process 10 (FIG. 10) to determine a current to be supplied to the diode laser to operate it efficiently at a predetermined power output level. At state 1000, process 10 (FIG. 10) sets the XTEC at an initial temperature, and then at state 1005 determines the corresponding diode current required to produce the predetermined output power level. At state 1010, process 10 incrementally adjust the temperature of the XTEC (e.g., by changing a resistance value in the XTEC controller a fixed amount of between about 50 and 500 ohms). At state 1015 the diode current is again measured. At state 1020, the process 10 determines if additional incremental adjustments to the XTEC should be made, if so, process 10 proceeds back to state 1010 where the XTEC is incremented again. Typically, the temperature of the XTEC is incrementally adjusted to encompass a range of temperatures around a reference temperature (which may correspond to resistance changes from 500 ohms less than the last XTEC temperature reference setting, to 500 ohms beyond the temperature reference setting, in 100 ohm steps) in order to determine the minimum diode current vs. temperature setting. Upon completion of the temperature scan, at state 1025 the lowest current and associated temperature from the scan are determined, and at state 1030 process 10 sets the XTEC to the associated temperature. Finally, at state 1035, values indicative of the diode current and the selected XTEC temperature setting are provided to the control system process 9.

Referring again to FIG. 9, at state 905 process 9 sets the XTEC temperature as determined by process 10, and receives the associated diode current value and the XTEC base plate temperature, and records these values at state 910. Then, process 9 proceeds in parallel to check to see if it needs to run a conversion efficiency process as illustrated in states 915, 920 and 925, or run a noise control process as illustrated in states 930, 935, and 945. In example of a conversion efficiency process 11 is illustrated in more detail in FIG. 11. In example of a noise control process 12 is illustrated in more detail in FIG. 12.

Figure 11:
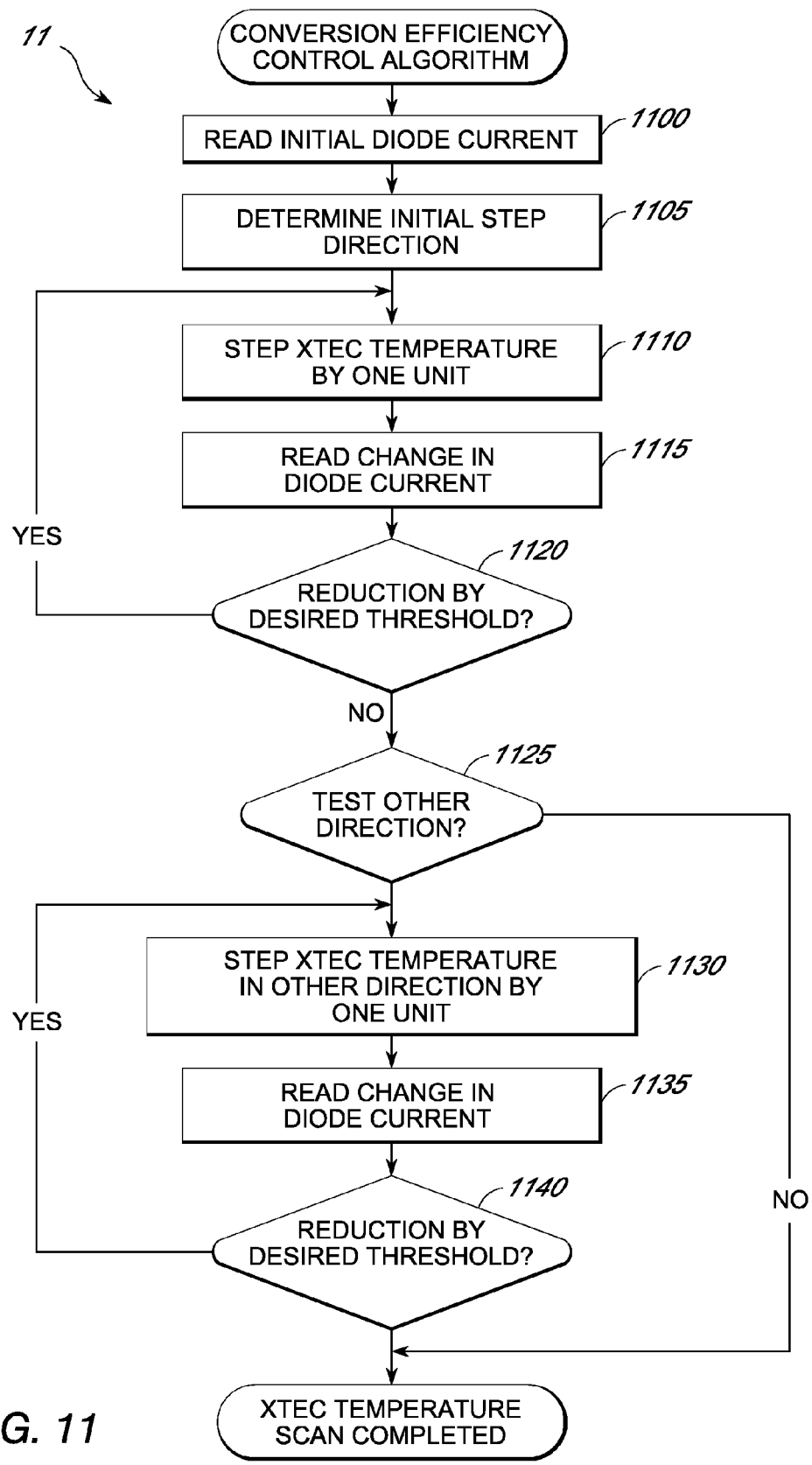
FIG. 11 is a flow diagram illustrating a conversion efficiency process for a laser system.

For the conversion efficiency process, in state 915, process 9 monitors the diode current and periodically (which can also be continuously or nearly continuously) at state 920. While the laser is in an "on" state, the low-diode-current reading measured during the XTEC temperature-scan will be compared to the ongoing operational diode-current readings, and will be set to the low diode-current reading if it is lower than the previous low diode-current reading. Subsequently, while lasing, the operational diode-current will be continually checked for an increase of a predetermined or dynamically amount from the last low-diode-current reading. An increase (e.g., 5-15%, typically 10%) will trigger the conversions efficiency process at state 925 to incrementally adjust the temperature of the XTEC to reduce the diode current. Referring now to FIG. 11, the conversion efficiency process 11 reads the initial diode current at state 1100. At state 1105, process determines an initial step direction for the XTEC temperature setting, the initial direction determined by the base-plate temperature at that point versus the previously recorded base-plate temperature. The XTEC temperature-setting is adjusted by a set amount, e.g., 100 ohms, in the initial step direction at state 1110. Upon stepping in any direction, the diode-current reading is obtained at state 1115. At state 1120, the new diode current reading is compared to the recorded reading to determine if a reduction in diode current occurred. If the diode-current is reduced by a certain amount (e.g., 2%), subsequent adjustments in the same direction will be made until diode current readings do not achieve the amount of decrease in diode current for each step, and the temperature setting of the XTEC and the corresponding diode current is recorded. At state 1125, if the initial 100 ohm step does not achieve the desired decrease in diode-current 1125, process 11 proceeds to perform a similar step adjustment in the other direction at state 1030, reading changes in the diode current 1135, and checking to see if the current is reduced at state 1140 until the desired diode decrease requirement is no longer met. At the termination of this process 11, the associated low diode-current reading and the base-plate temperature are provided to the control system process 9 where they are recorded for subsequent use at state 910.

Simultaneously, at state 930, noise in the output power of the laser output is monitored, for example, by using the APC system 845 (FIG. 8) and the value indicative of an AC component (output noise) provided to the noise control system. The monitored optical noise is checked to see if it has increased above a threshold value (e.g., 10%) from a previous value (e.g., a predetermined or a dynamically determined threshold) at state 935. If so, at state 945 process 9 runs a noise control algorithm to adjust the temperature of the XTEC, and correspondingly the waveguide, to reduce the optical noise.

Figure 12:
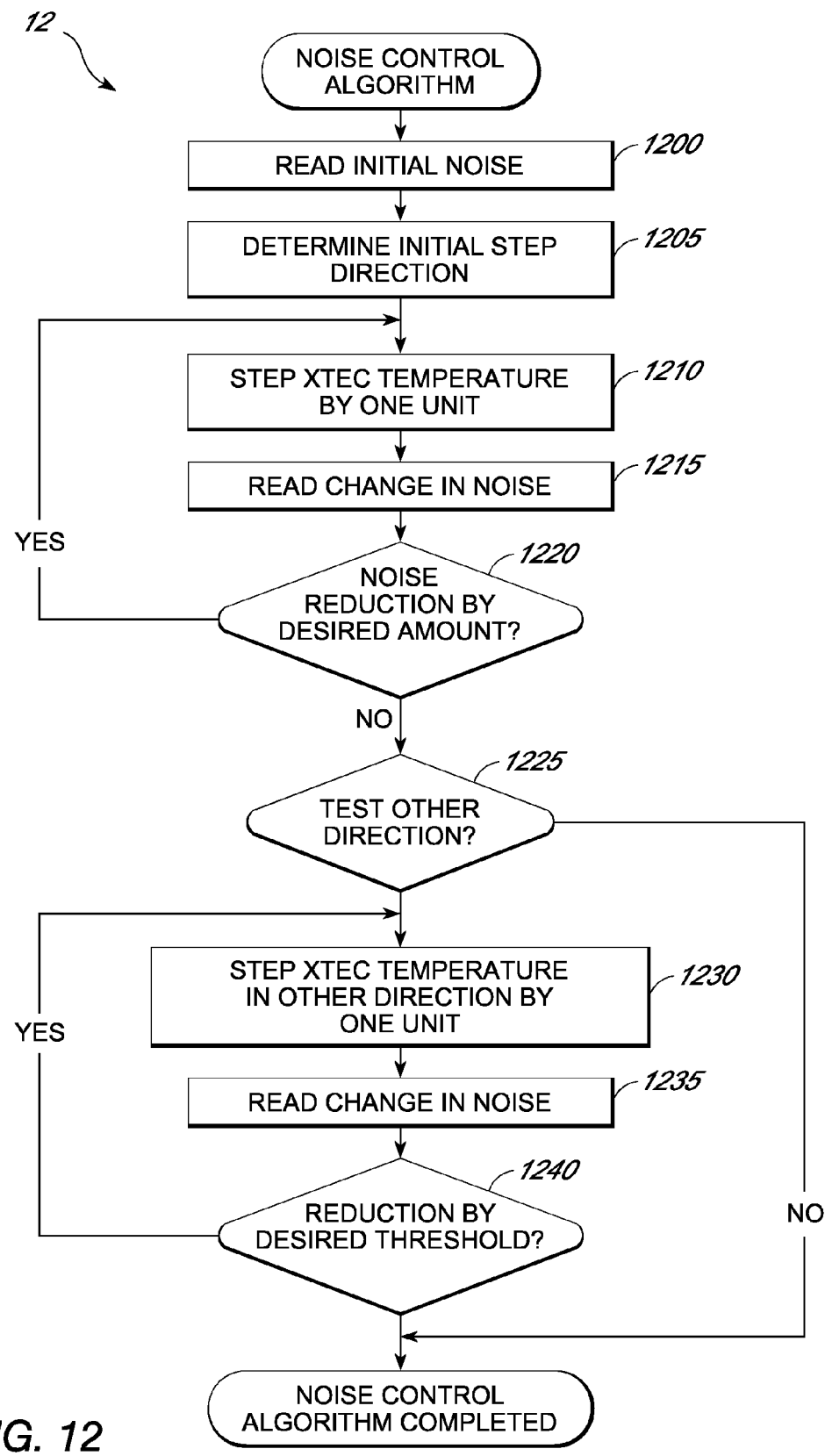
FIG. 12 is a flow diagram illustrating a noise control process for a laser system.

One embodiment of such a noise control process 12 is illustrated in FIG. 12. Process 12 begins by obtaining a value indicative of the "initial" noise of the output laser, which can be provided by the APC system 1245. At state 1205, the initial direction for adjusting the temperature is determined step by the base-plate temperature at that instance versus a previously recorded base-plate temperature, for example, the initial direction for adjusting the temperature will be towards the previously recorded base-plate temperature value. Upon incrementally changing the temperature of the XTEC by one step (e.g., changing the resistance of a heating element in the XTEC by 100 ohms) in the initial direction, the optical noise reading is again obtained at state 1215 At state 1220, process 12 determines if a reduction in optical noise by a certain amount (e.g., 2%) occurred. If so, process 12 loops back to state 1210 and makes subsequent temperature adjustment steps in the same direction will be made until optical noise readings do not achieve a decrease in optical noise. At state 1225, if the temperature adjustments sufficiently reduced the optical noise, process 12 is completed; but if the initial temperature adjustment step did not achieve the desired decrease in optical noise process 12 determines to test in the other direction. At state 1230, the step direction is reversed so that the temperature is adjusted in the other direction, the optical noise is again obtained (state 1235), and process 12 continues to make temperature adjustments in that direction until it is determined, at state 1240, that the adjustment does not further decrease the optical noise, and then process 12 is completed. At the termination of this routine, the associated low optical noise reading and the base-plate temperature are recorded.

Figure 13:
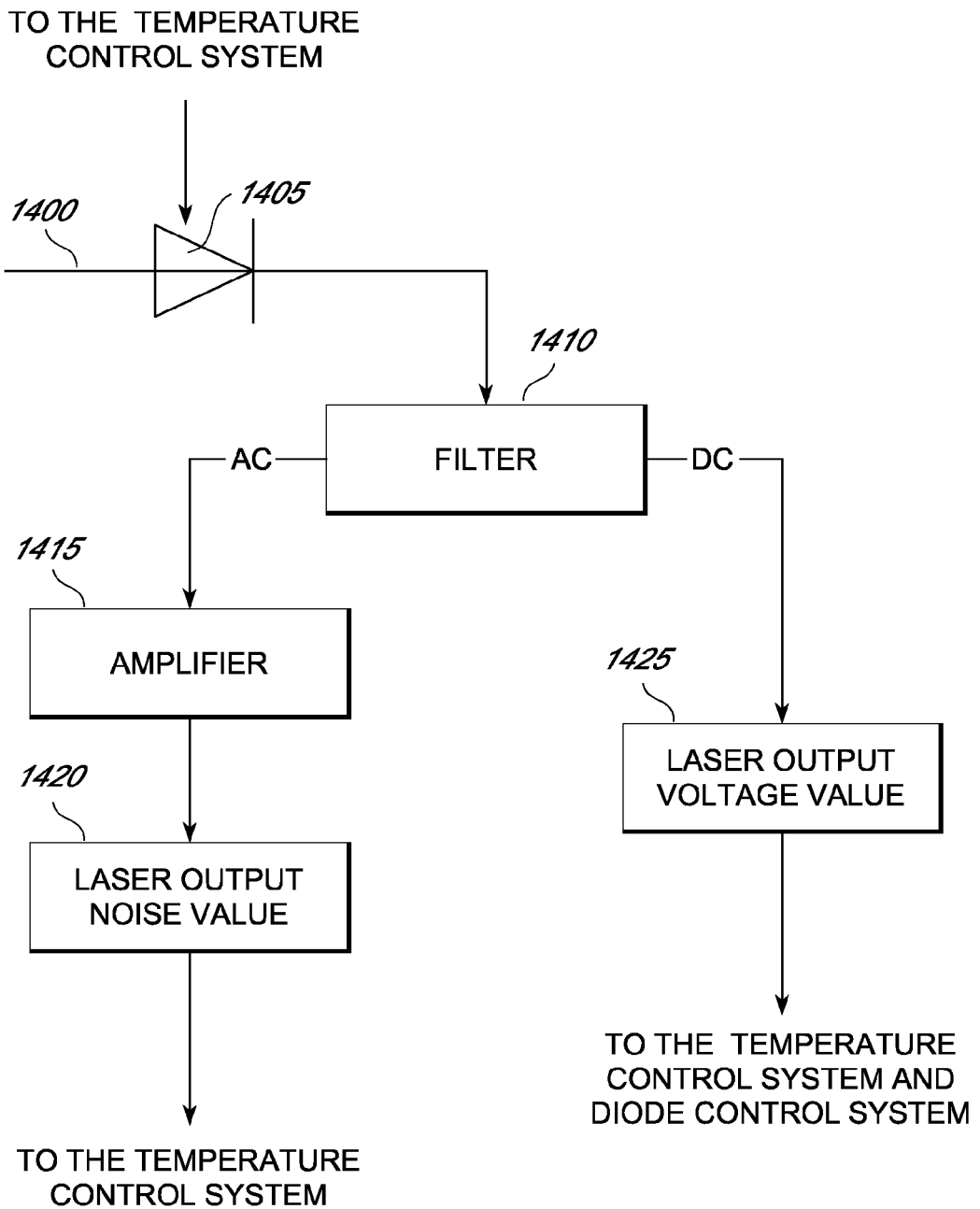
FIG. 13 is a schematic illustrating an APC system.

FIG. 13 is a schematic diagram of one embodiment of an APC system, for example APC system 845 of the laser system shown in FIG. 8. The system includes a photodiode 1405 arranged to receive a fraction of the reflected laser beam output 1400 provided by a beam splitter 840 (FIG. 8). Two portions of the photodiode output, a DC component and an AC component, are separated by a filter 1410. The DC component is applied to control the diode current and the conversion efficiency controller by providing a laser output power value 1425 indicative of the output power to the temperature control system 855 and the diode control system 800. An amplifier 1415 amplifies the AC component and a value indicative of a laser output noise value 1420 is supplied to the temperature control system 855.

Figure 14:
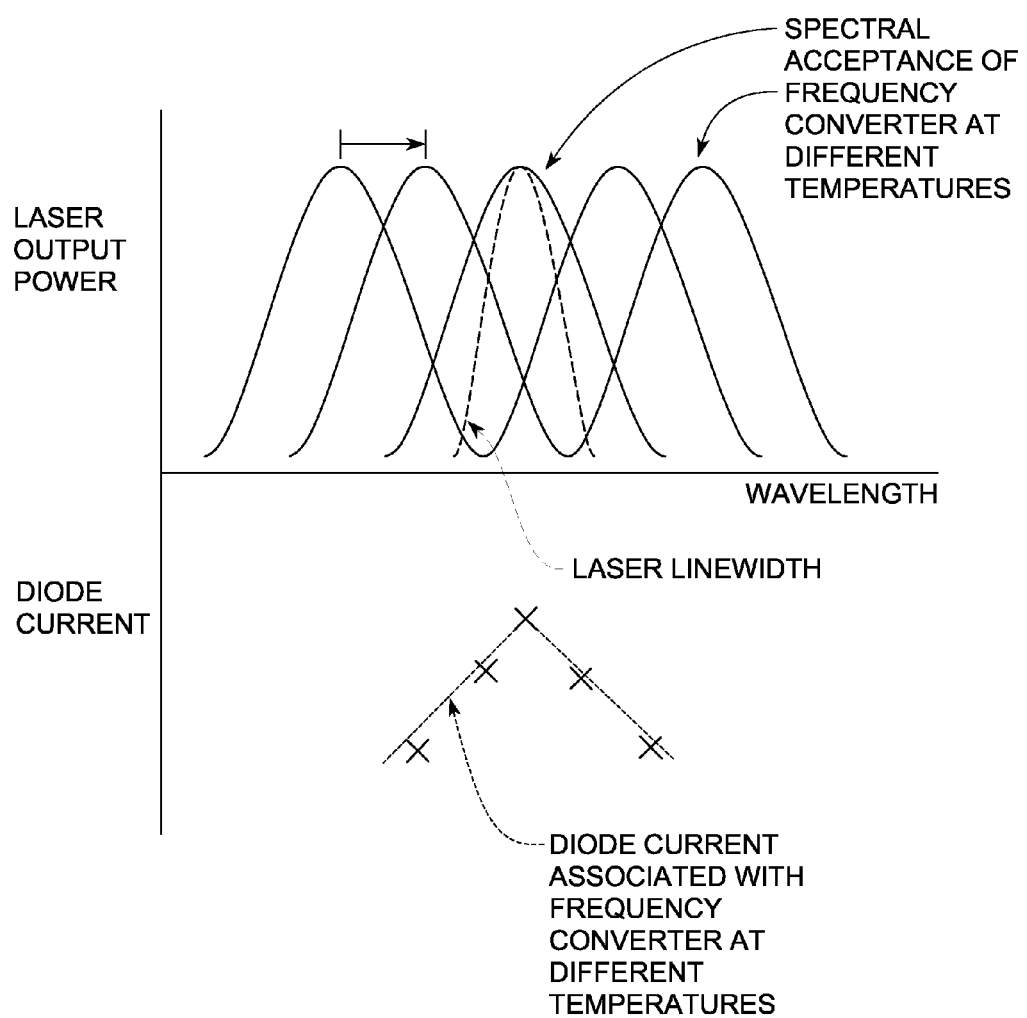
FIG. 14 is a graph illustrating efficiency of a diode laser frequency converted laser system as a function of temperature.

The above-described thermal connectors and temperature control systems can affect the efficiency and quality of a laser system output. Further details of temperature-related frequency conversion issues are discussed below. FIG. 14 is a graph that shows the relationship between the linewidth of the laser light input to the frequency converter at one wavelength, the spectral acceptance of the frequency converter at different temperatures, and the diode current. Generally, stepping the temperature of XTEC shifts the spectral acceptance center wavelength, causing a change in frequency-converted output, which in turn causes the diode current to compensate for the difference in power output. This diode current is monitored and used by the temperature control system as described herein. As can be seen from FIG. 15, the lowest diode current is associated with an approximate alignment of the center wavelengths of the diode laser and the spectral acceptance of the frequency converter.

In a diode-pumped solid-state laser system it can be advantageous to reduce the amount of pump diode current required to maintain a constant output power from the laser system, thereby minimizing the power consumption of the system. For a laser system comprising a pump diode laser whose output wavelength is stabilized with a grating, and whose output frequency is subsequently doubled to provide second harmonic generated output, a method described herein reduces the amount of pump diode current (and therefore the amount of pump diode power) required by temperature-tuning the nonlinear crystal such that its maximum doubling efficiency peak aligns to the pump diode wavelength peak.

The nonlinear frequency doubling process is wavelength dependent; e.g., the efficiency of the doubling process is dependent upon the spectral bandwidth of the pump source as well as the spectral acceptance of the nonlinear crystal. In most nonlinear systems, the spectral acceptance is not a step-function, and is therefore not constant over wavelength. Namely, there exists a "spectral roll-off" wherein the doubling efficiency of the nonlinear crystal varies over wavelength. This implies that as the phase match temperature of the nonlinear crystal is tuned such that its peak does not coincide with the spectral peak of the pump source, most of the power of the pump source will lie on this spectral roll-off curve. The amount of second harmonic generation power will then be more sensitive to fluctuations present on the pump source. For pump sources that run on a multiplicity of longitudinal modes, mode beating noise can contribute significantly to second harmonic generation noise.

Figure 15:
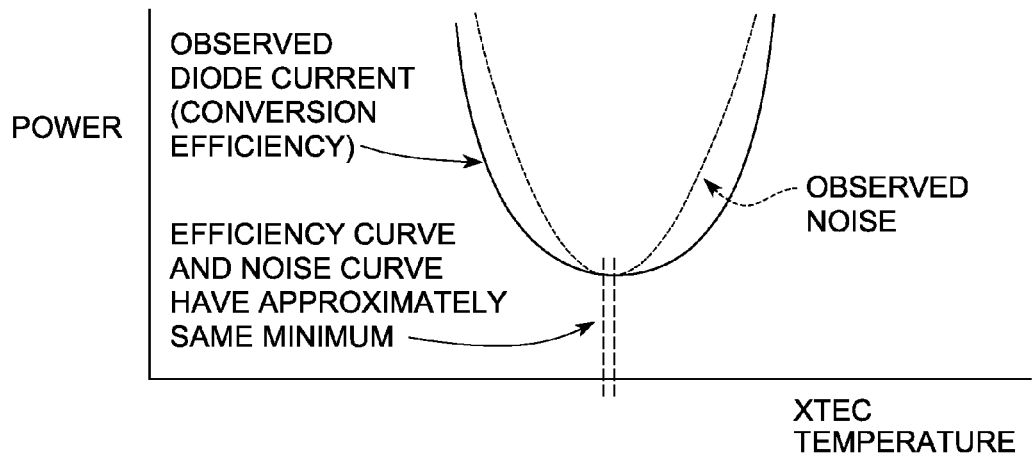
FIG. 15 is a graph illustrating a conversion efficiency curve and a noise curve of a diode laser frequency converted laser system in which the two curves have approximately the same minimum.
Figure 16:
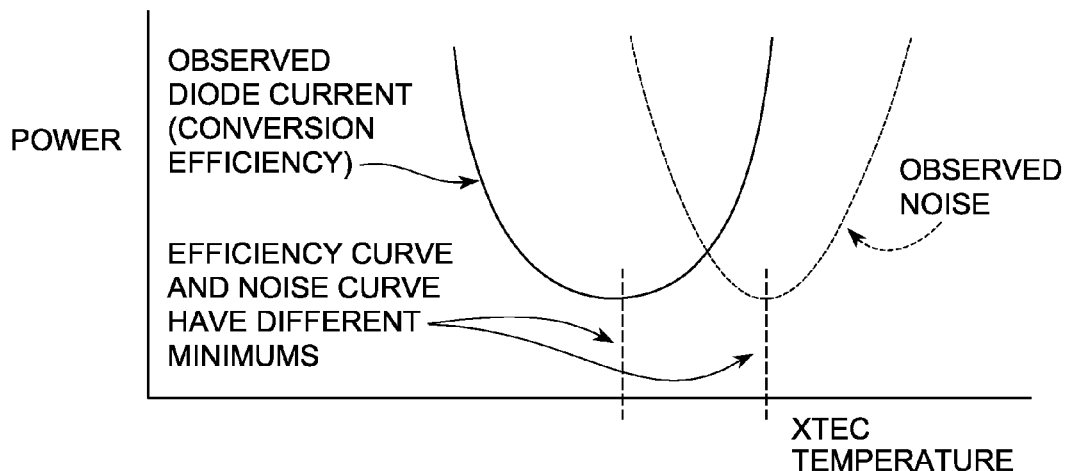
FIG. 16 is a graph illustrating a conversion efficiency curve and a noise curve of a diode laser frequency converted laser system in which the two curves have different minimums.

Reference is now made to FIGS. 15 and 16. If the spectral distribution of the pump source and the doubling efficiency curve of the nonlinear crystal were symmetric about a center peak wavelength, then it would be possible for a given phase match temperature of the nonlinear crystal to reduce both the pump diode current required to achieve a given SHG output power (e.g., the minimum diode current required) and the noise present in the SHG output. This is shown in FIG. 15, where the noise control curve meets the conversion efficiency curve at about the same minimum XTEC temperature.

However, if the spectral distribution of the pump were asymmetric, then the phase match temperature used to achieve the minimum pump diode current (for a given SHG output power) and that used to achieve the minimum noise would be different. This is shown in FIG. 16, where the minimums do not have the same minimum XTEC temperature.

If the curves do not have the same minimum XTEC temperature, then a weighting algorithm may be used to determine the desired XTEC temperature; the operator may determine the relative values of efficiency versus cleanliness of signal. In picking the desired temperature, an operator may weigh the two dependent variables evenly (50-50) or unevenly (e.g., 80-20). It has been found that a higher weight given to the noise correction can be useful.

In any of the processes specifically described above, one or more steps may be added, or deleted, or the order may be changes without departing from at least one of the aspects of the invention. Additionally, one or more components may be added or removed from the structured described herein, or reordered, or replaced with other suitable components without departing from the scope of the invention. Although various inventive aspects are described above for embodiments of some specific types of semiconductor lasers, other laser systems (e.g., an external cavity diode laser, a fiber Bragg grating stabilized laser, a single mode diode chip and other types of lasers) and embodiments may also incorporate such aspects.

Those of ordinary skill would further appreciate that the various illustrative logical blocks, modules, and algorithm steps described in connection with the examples disclosed herein may be implemented as electronic hardware, firmware, computer software, middleware, microcode, or combinations thereof. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an Application Specific Integrated Circuit (ASIC). To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the disclosed methods.

Those of ordinary skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. The various illustrative logical blocks, components, modules, and circuits described in connection with the examples disclosed herein (see for example FIGS. 9-12) may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

Any of these temperature-controlling or temperature-adjusting embodiments described herein can be implemented in a particular laser apparatus. Each embodiment can stand alone, or a plurality of embodiments can be combined to provide greater levels of temperature control and thermal stabilization. It will be appreciated by those skilled in the art, in view of these teachings, that alternative embodiments may be implemented without deviating from the spirit or scope of the invention. This invention is to be limited only by the following claims, which include all such embodiments and modifications when viewed in conjunction with the above specification and accompanying drawings.

We claim:

1. A frequency converted laser system, comprising:
   a laser system configured to produce a laser beam having a first frequency, said laser system comprising an optical medium comprising a Bragg grating;
   a waveguide comprising at least one nonlinear material, said waveguide being configured to receive an input laser beam of a first frequency from said diode laser system and emit an output laser beam having a second frequency, the second frequency different than the first frequency;
   a power control system optically coupled with said waveguide and configured to monitor said output laser beam, said power control system being configured to provide a first signal indicative of noise in said output laser beam;
   a temperature control system connected to said power control system to receive said first signal, said temperature control system comprising
      a first temperature controlled element connected to said waveguide for controlling a temperature of the waveguide, and
      a controller configured to control the temperature of said temperature controlled element,
      wherein said temperature control system is configured to adjust the temperature of said first temperature controlled element to reduce noise in said output laser beam based on said first signal; and
   a thermal connector connected to said first temperature controlled element and connected to at least a portion of said optical medium comprising said Bragg grating, said thermal connector thermally coupling said first temperature controlled element and said Bragg grating such that the temperature of said Bragg grating is related to the temperature of said first temperature controlled element.

2. The frequency converted laser system of claim 1, wherein said power control system is further configured to derive said first signal based on an AC component in said output laser beam indicating a noise level in said output laser beam.

3. The frequency converted laser system of claim 2, wherein said temperature control system is configured to adjust the temperature of said first temperature control element when the first signal indicates the noise level is greater than a predetermined threshold value.

4. The frequency converted laser system of claim 1, wherein the laser system comprises a fiber Bragg grating stabilized laser, and wherein said optical medium comprises optical fiber.

5. The frequency converted laser system of claim 1, wherein the laser system comprises an external cavity diode laser.

6. The frequency converted laser system of claim 5, wherein the external cavity diode laser comprises a volume Bragg grating.

7. The frequency converted laser system of claim 1, where the temperature controlled element comprises a thermo-electric cooler.

8. A frequency converted laser system, comprising:
a laser system configured to produce a laser beam having a first frequency, said laser system comprising an optical medium comprising a Bragg grating;
a waveguide comprising at least one nonlinear material, said waveguide being configured to receive an input laser beam of a first frequency from said diode laser system and emit an output laser beam having a second frequency, the second frequency different than the first frequency;
a power control system optically coupled with said waveguide and configured to monitor said output laser beam, said power control system being configured to provide a first signal indicative of noise in said output laser beam;
a temperature control system connected to said power control system to receive said first signal, said temperature control system comprising
a first temperature controlled element connected to said waveguide for controlling a temperature of the waveguide, and
a controller configured to control the temperature of said temperature controlled element,
wherein said temperature control system is configured to adjust the temperature of said first temperature controlled element to reduce noise in said output laser beam based on said first signal;
a second temperature controlled element; and
a thermal connector connected to at least a portion of said optical medium having said Bragg grating, said thermal connector thermally coupling said second temperature controlled element and said Bragg grating such that the temperature of said Bragg grating is related to the temperature of said second temperature controlled element.

9. A frequency converted laser system, comprising:
a laser system configured to produce a laser beam having a first frequency, said laser system comprising an optical medium comprising a Bragg grating;
a waveguide comprising at least one nonlinear material, said waveguide being configured to receive an input laser beam of a first frequency from said laser system and emit an output laser beam having a second frequency, the second frequency different than the first frequency;
a power control system optically coupled with said waveguide and configured to monitor said output laser beam, said power control system being configured to provide a first signal indicative of power in said output laser beam;
a diode control system connected to said power control system to receive said first signal, said diode control system configured to control a drive current supplied to drive said laser system based on said first signal; and
a temperature control system connected to said diode control system to receive a second signal indicative of said drive current level, said temperature control system comprising
a first temperature controlled element connected to said waveguide for controlling the temperature of the waveguide, and
a controller configured to control the temperature of said temperature controlled element,
wherein said temperature control system is configured to adjust the temperature of said first temperature controlled element to reduce said drive current.

10. The frequency converted laser system of claim 9, wherein the temperature control system is configured to adjust the temperature when said second signal indicates said drive current has increased by a predetermined amount from a previously indicated drive current level.

11. The frequency converted laser system of claim 9, wherein said temperature control system is further configured to adjust the temperature by changing the temperature of said waveguide in a first direction and observing a change in said drive current as indicated by said second signal, and if a reduction in said drive current is observed then continuing to change the temperature of the waveguide in the first direction until the drive current is below a threshold value, and if a reduction in said drive current is not observed, then adjusting the temperature of said waveguide in a second direction, opposite the first direction, and if a decrease said drive current is observed, then continuing to change the temperature of the waveguide in the second direction until said drive current is below said threshold value.

12. The frequency converted laser system of claim 9, wherein the laser system comprises a fiber Bragg grating stabilized laser, and wherein said optical medium comprises optical fiber.

13. The frequency converted laser system of claim 9, wherein the laser system comprises an external cavity diode laser.

14. The frequency converted laser system of claim 13, wherein the external cavity diode laser comprises a volume Bragg grating.

15. A method for reducing noise in a laser system having a frequency converter, comprising:
monitoring a frequency converted output laser beam;
detecting a noise component of said output laser beam;
determining a noise value indicative of said noise component; and
adjusting a temperature of the frequency converter to reduce said noise value, wherein adjusting the temperature comprises
if said noise value exceeds a noise threshold value, adjusting the temperature of the frequency converter in a first direction and monitoring the change in said noise value, and if said noise value decreases, then continue to adjust the temperature in the first direction until an increase in said noise value is observed, and if said noise value increases when adjusting the temperature in the first direction, adjusting the temperature in a second direction opposite the first direction and monitoring a second change in said noise value, and if a decrease in said noise value is observed, then continuing to change the temperature in the second direction until an increase in said noise value is observed.

16. The method of claim 15, wherein said noise component comprises an AC component in the output laser beam.

17. A method for operating a frequency-converted diode laser system, the method comprising:

monitoring a laser beam from the frequency converted diode laser system;

determining a power value indicative of the output power of said laser beam;

providing an amount of current to said laser diode system responsive to said power value such that said provided current amount maintains said output power at a predetermined level; and if said current amount exceeds a threshold value, adjusting the temperature of a frequency converter to reduce said current amount while maintaining said output power at said predetermined level.

18. The method of claim 17, wherein said adjusting the temperature includes changing the temperature of the frequency converter in a first direction and monitoring a first change in said current amount, and if a reduction in said current amount occurs, continuing to change the temperature of the frequency converter in the first direction until said current amount is no longer being reduced, and if a reduction in said current amount does not occur, then changing the temperature of the frequency converter in a second direction, opposite the first direction, and monitoring a second change in said current amount and if a decrease in said current amount occurs, then continuing to change the temperature of the frequency converter in the second direction and monitoring a change in the output power until said current amount is no longer reduced.

19. The method of claim 18, wherein said threshold value is about 5% above a previously provided low current amount.

20. The method of claim 18, wherein said threshold value is about 10% above a previously provided low current amount.

21. A method for reducing noise and efficiently operating a frequency converted laser system, the method comprising:

monitoring a frequency converted laser beam output;

monitoring an amount of current provided to drive said laser system to produce said laser beam output;

determining an AC component and a DC component of said monitored laser beam output, the magnitude of the AC component being indicative of output noise of said monitored laser beam output, and the DC component being indicative of power of said monitored laser beam output; and adjusting a temperature of a frequency converter responsive to said AC component and said DC component to reduce the output noise of said laser beam output, and to reduce said amount of current.

22. A method of operating a frequency converted laser system laser controlled by a power control system that regulates drive current supplied to drive the laser system to produce a laser beam having consistent output power, the method comprising:

storing a first current value indicative of a low amount of said drive current used to produce a laser beam output having a first power level;

storing a temperature value indicative of the temperature of a frequency converter while producing the laser beam having said first power level;

monitoring a second current provided to the diode laser;

determining if a difference between said first current value and said second current exceeds a threshold value; and if the difference exceeds the threshold value, adjusting the temperature of the frequency converter to reduce said drive current while maintaining said first power level of the laser beam output.

* * * * *

UNITED STATES PATENT AND TRADEMARK OFFICE
CERTIFICATE OF CORRECTION

PATENT NO. : 8,238,389 B2
APPLICATION NO. : 13/035727
DATED : August 7, 2012
INVENTOR(S) : Hargis et al.

It is certified that error appears in the above-identified patent and that said Letters Patent is hereby corrected as shown below:

In column 2 at line 20, before "a" delete "the".

In column 3 at line 29, change "The" to --the--.

In column 3 at line 38, after "decrease" insert --in--.

In column 4 at line 3, before "adjusting" delete "the".

In column 8 at line 19, after "on" insert --at--.

In column 8 at line 20, after "portion" insert --of--.

In column 11 at line 6, after "or" delete "less than".

In column 15 at line 59, after "1215" insert --.--.

In column 18 at line 42, in Claim 1, after "said" delete "diode".

In column 19 at line 10 (approx.), in Claim 3, change "control" to --controlled--.

In column 19 at line 25, in Claim 7, after "the" insert --first--.

In column 19 at line 33, in Claim 8, after "said" delete "diode".

In column 20 at line 11 (approx.), in Claim 9, after "a" insert --level of--.

In column 20 at line 19, in Claim 9, change "the" to --a--.

In column 20 at line 21, in Claim 9, after "said" insert --first--.

In column 20 at line 29, in Claim 10, after "current" insert --level--.

In column 20 at line 35, in Claim 11, before "as" insert --level--.

In column 20 at line 36, in Claim 11, after "current" insert --level--.

In column 20 at line 38, in Claim 11, after "current" insert --level--.

In column 20 at line 39, in Claim 11, after "current" insert --level--.

In column 20 at line 41, in Claim 11, after "decrease" insert --in--.

In column 20 at line 41, in Claim 11, after "current" insert --level--.

In column 20 at line 43, in Claim 11, after "current" insert --level--.

Signed and Sealed this
Second Day of April, 2013

Teresa Stanek Rea
*Acting Director of the United States Patent and Trademark Office*

CERTIFICATE OF CORRECTION (continued)
U.S. Pat. No. 8,238,389 B2

In column 20 at line 66, in Claim 15, change "the" to --a first--.

In column 20 at line 67, in Claim 15, change "continue" to --continuing--.

In column 21 at line 12, in Claim 17, change "frequency-converted" to --frequency converted--.

In column 21 at line 16, in Claim 17, change "the" to --an--.

In column 21 at line 18, in Claim 17, change "laser diode" to --diode laser--.

In column 21 at line 23, in Claim 17, change "the" to --a--.

In column 22 at line 29, in Claim 22, change "the" to --a--.